(12) United States Patent
Vereecken et al.

(10) Patent No.: US 7,368,045 B2
(45) Date of Patent: May 6, 2008

(54) GATE STACK ENGINEERING BY ELECTROCHEMICAL PROCESSING UTILIZING THROUGH-GATE-DIELECTRIC CURRENT FLOW

(75) Inventors: Philippe M. Vereecken, Sleepy Hollow, NY (US); Veeraraghavan S. Basker, Yorktown Heights, NY (US); Cyril Cabral, Jr., Mahopac, NY (US); Emanuel I. Cooper, Scarsdale, NY (US); Hariklia Deligianni, Tenafly, NJ (US); Martin M. Frank, New York, NY (US); Rajarao Jammy, Hopewell Junction, NY (US); Vamsi Krishna Paruchuri, New York, NY (US); Katherine L. Saenger, Ossining, NY (US); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 11/050,790

(22) Filed: Jan. 27, 2005

(65) Prior Publication Data

US 2006/0166474 A1 Jul. 27, 2006

(51) Int. Cl.
*C25D 5/02* (2006.01)
*C25D 11/04* (2006.01)

(52) U.S. Cl. ..................... 205/118; 205/324

(58) Field of Classification Search ............... 205/159, 205/157, 118, 123, 291; 204/324
See application file for complete search history.

(56) References Cited

U.S. PATENT DOCUMENTS

| | | | | | |
|---|---|---|---|---|---|
| 1,949,131 | A | * | 2/1934 | Shields | 205/264 |
| 3,320,484 | A | * | 5/1967 | Riley et al. | 257/533 |
| 3,634,203 | A | * | 1/1972 | McMahon et al. | 205/124 |
| 3,827,949 | A | * | 8/1974 | Platter et al. | 205/124 |
| 4,459,739 | A | * | 7/1984 | Shepherd et al. | 438/157 |
| 4,460,413 | A | * | 7/1984 | Hirata et al. | 438/297 |
| 4,564,720 | A | * | 1/1986 | Hogan | 136/256 |
| 5,032,237 | A | * | 7/1991 | Wieserman et al. | 205/188 |
| 5,196,361 | A | * | 3/1993 | Ong et al. | 438/264 |
| 6,224,735 | B1 | * | 5/2001 | Akutsu et al. | 205/91 |
| 6,309,969 | B1 | * | 10/2001 | Oskam et al. | 438/687 |
| 6,707,100 | B2 | * | 3/2004 | Gajda | 257/330 |
| 6,797,145 | B2 | * | 9/2004 | Kosowsky | 205/221 |
| 6,899,815 | B2 | * | 5/2005 | Coomer et al. | 216/13 |
| 7,105,886 | B2 | * | 9/2006 | Droopad | 257/310 |
| 2003/0155246 | A1 | * | 8/2003 | Schimmel et al. | 205/93 |
| 2003/0201442 | A1 | * | 10/2003 | Makita | 257/66 |

* cited by examiner

*Primary Examiner*—Nam Nguyen
*Assistant Examiner*—Luan V. Van
(74) *Attorney, Agent, or Firm*—Connolly Bove Lodge and Hutz; Robert M. Trepp

(57) ABSTRACT

A method is provided for electroplating a gate metal or other conducting or semiconducting material directly on a dielectric such as a gate dielectric. The method involves selecting a substrate, dielectric layer, and electrolyte solution or melt, wherein the combination of the substrate, dielectric layer, and electrolyte solution or melt allow an electrochemical current to be passed from the substrate through the dielectric layer into the electrolyte solution or melt. Methods are also provided for electrochemical modification of dielectrics utilizing through-dielectric current flow.

39 Claims, 20 Drawing Sheets

GATE STACK ENGINEERING BY ELECTROCHEMICAL PROCESSING UTILIZING THROUGH-GATE-DIELECTRIC CURRENT FLOW

FIELD OF THE INVENTION

This invention relates to electroplating on a gate dielectric to form a gate electrode. In general, the invention pertains to electrochemical processes such as electrodeposition, electroetching, and/or electromodification, implemented in such a manner as to allow current flow through at least one dielectric layer.

BACKGROUND OF THE INVENTION

Electrochemical processing of oxides on metals and semiconductors is well-known in the art of passive oxide formation and electroetching. Formation of a passive native oxide on a substrate tends to be self-limiting, since the process stops when the electrochemically formed oxide is thick enough to prevent current flow. By correct control of the process conditions, good coatings can be obtained. In this regard, see, for example, U.S. Published Application No. 2002/0104761 A1, to Birss et al., the entire disclosure of which is incorporated herein by reference.

The formation of reliable $SiO_2$ gate oxides on p-type Si by a combination of electrochemical anodization and conventional oxide formation techniques has been shown by W-J. Lia et. al., in *J. Electrochem. Soc.* 151 (9) G549-G553 (2004), the entire disclosure of which is incorporated herein by reference Rare-earth oxides have been directly deposited onto a substrate from organic as well as aqueous electrolytes containing salts of a rare earth metal. For example Y. Matsuda et al. have electrodeposited $Y_2O_3$ and $Y_2O_3$:Eu(III) on conductive $SnO_2$ substrates using dimethylformide (DMF) with added $YCl_3$ and $EuCl_3$ salts, as described in the *Journal of Alloys and Compounds*, 193, 277-279 (1993), the entire disclosure of which is incorporated herein by reference. In addition, M. A. Petit et al. have electrodeposited conductive iridium oxide films on $SnO_2$ substrates from an aqueous solution of $K_3IrCl_6$, oxalic acid and potassium carbonate, as described in *Electroanal. Chem.* 444, 247-252 (1998), the entire disclosure of which is incorporated herein by reference.

A prior art approach to electrochemical modification of gate oxides is described in U.S. Pat. No. 6,352,939 to Hwu et. al., the entire disclosure of which is incorporated herein by reference. In this approach, a low-level current (0.1-10 $\mu A/cm^2$) is passed through gate a dielectric in a Si(substrate)/gate oxide/electrolyte structure towards a metal plate in an aqueous electrolyte solution. The disruption to the bonds throughout the thickness of the dielectric is then repaired by a post-treatment anneal. Improved dielectric properties were reported for $SiO_2$, $Si_3N_4$ and $Ta_2O_5$. However, no chemical modifications (i.e., introduction of new elements not already in the dielectric) would be expected with the non-reactive solution chemistry employed (dilute aqueous HF), and the treatment is directed toward modifying the bulk of the dielectric, rather than its surface.

In the art of electrodeposition for semiconductor manufacturing and for fabrication of metal structures on dielectrics, the electrodeposited metal is nearly always deposited on a metallic seed or plating base layer formed on a substrate by a method other than electrodeposition (e.g., physical vapor deposition (PVD), chemical vapor deposition (CVD), etc.). The main path for the current flow driving the electrodeposition is laterally through the seed layer, from contact established at the seed layer edges. Current through the substrate itself, and any dielectric layers contained therein, is typically completely negligible. Plating can be limited to selected areas of the seed layer by using though-mask plating techniques, wherein one plates through the openings in an insulating masking layer disposed directly on the seed layer.

High performance CMOS devices can be expected to increasingly incorporate high-k gate dielectrics and metal gates. In the fabrication of metal gates, the conventional approach has been subtractive, i.e., the metal gate material is applied as a blanket layer and then selectively removed from regions where it is not wanted. The above electrodeposition approach has been described as an additive method for forming metal gates for field effect transistors in U.S. patent application Ser. No. 10/694,793 entitled "Field Effect Transistor with Electroplated Metal Gate," the entire disclosure of which is incorporated herein by reference. The gate metal may be selectively deposited on the desired gate regions by through-mask plating onto a blanket conductive seed layer, which would typically be removed from the masked regions after the plating process. This prior art further discloses that the gates for n-FET and p-FET devices have different work functions and comprise different metals, which means that the additive through-mask plating approach must be done more than once.

It would therefore be desirable to provide a method of plating a gate metal directly onto a gate dielectric without the need for a seed layer. It would also be desirable to have a through-mask plating method which could selectively plate a first material in a first subset of mask openings and then selectively plate a second material into a second subset of mask openings, where the first and second subsets of mask openings differ in the doping of the semiconductor material under the gate dielectric. In addition, it would be desirable to have a method of gate dielectric interface engineering, whereby the properties of the gate material can be altered or fine-tuned by surface modification.

SUMMARY OF THE INVENTION

The present invention relates to a method for electroplating a gate metal or other conducting or semiconducting material on a gate dielectric. The method comprises selecting a substrate, dielectric layer, and electrolyte solution or melt, wherein the combination of the substrate, dielectric layer, and electrolyte solution or melt allow an electrochemical current to be passed from the substrate through the dielectric layer and into the electrolyte solution or melt. The method further comprises providing at least one electrical contact to at least one of the substrate and dielectric layer, providing at least one auxiliary electrode in contact with the electrolyte solution or melt, and electroplating the gate metal or conducting or semiconducting material on the dielectric layer. In addition, the present invention relates to gate electrodes comprising gate metals or other conducting or semiconducting materials that have been electroplated onto a dielectric layer according to the above method.

The present invention provides an electrodeposition method for forming metal directly on a dielectric comprising at least one dielectric layer, by using a current flow through the thickness of the dielectric. More generally, this invention provides a method for forming metals or other platable materials, such as alloys, semiconductors, conductive oxides, composites, conductive polymers, and/or semiconducting polymers, directly on an insulating layer.

In a first aspect of the invention, the electrodeposition is nonselective and relatively uniform over the surface of a dielectric layer disposed on a conducting or semiconducting substrate. The substrate may be planar, or have some topography that makes it nonplanar.

In a second aspect of the invention, the electrodeposition is spatially selective.

Selective deposition may be accomplished:

by adding to or subtracting from the dielectric thickness in selected regions (wherein use is made of the fact that the electrodeposits will selectively form on thin dielectric regions having less resistance to current flow);

by changing the dielectric material in selected regions to make it more or less resistive to current flow, for example, by damaging the dielectric, reacting it with another material, or replacing and/or augmenting it with another dielectric; and/or by doping selected substrate regions so that electrodeposition will occur (or not occur) on the dielectric over those substrate regions while not occurring (or occurring) over substrate regions not so doped.

Dielectric-thickness-induced selectivity may be effected by making said at least one dielectric have a first total thickness in at least one first region where an electrochemical processing is desired and a second total thickness in at least one second region where electrochemical processing is not desired.

Dopant-induced selectivity may be effected by selecting a substrate having at least one first substrate region having a first carrier type and density over which electrochemical processing is desired, and at least one second substrate region having a second carrier type and density over which electrochemical processing is not desired.

Composition-induced selectivity may be effected by selecting a substrate having at least one first substrate region having a first composition over which electrochemical processing is desired, and at least one second substrate region having a second composition over which electrochemical processing is not desired.

The above methods of inducing selective deposition may be enhanced and/or enabled by suitable variation of the plating potential, as well as by introducing other external plating enablers such as light.

In a third aspect of the invention, electrochemical methods are provided for the surface modification of gate dielectrics for work function control, thickness definition, and thermal stability. The surface modification may be spatially selective or nonselective.

In a fourth aspect of the invention, electrochemical methods are provided for electroetching of thin dielectrics and/or electrodeposition of additional insulator films onto the thin dielectric by through-dielectric current flow. The electroetching and/or electrodeposition may be spatially selective or nonselective.

A fifth aspect of this invention provides structures made by the methods of this invention. In particular, the invention provides FET devices containing metal gates formed by electrodeposition directly onto the gate dielectric.

BRIEF DESCRIPTION OF THE DRAWINGS

These and other features of the present invention will become apparent upon consideration of the following detailed description of the invention when read in conjunction with the drawings, in which.

DETAILED DESCRIPTION OF THE INVENTION

Electrochemical processing of insulating materials or insulators can potentially occur where the insulator, typically a thin oxide coating on a metal or semiconductor, has some conductance to electrical current. For thin coatings, electron tunneling can be a primary mechanism for dielectric conductivity or current leakage which can be employed for electrochemical processing. Defects can also provide many electron states in the band gap of an insulator, and for a high density of gap states, these can also form a possible pathway for the electrical current. Conductance can also be provided by transport of charges directly through the valence or conduction band of the oxide. The latter case becomes important when working with semiconducting oxides such as TiO$_2$, ZnO and Ta$_2$O$_5$, as well as any n-type wide band-gap semiconductor.

Since electroplating generally occurs in solution, the possibility of an electrochemical current at the oxide/electrolyte interface depends on several factors. These factors include: the energetic position and density of electron states of the electrolyte with respect to the valence band edge, as well as the conduction band edge of the oxide and underlying semiconductor substrate. Whether an electrical current develops, in view of these factors, is dependent on the principle that charge transfer at an interface occurs between filled and empty electron states where the same energy exists at both sides of an interface.

Figure 1C:
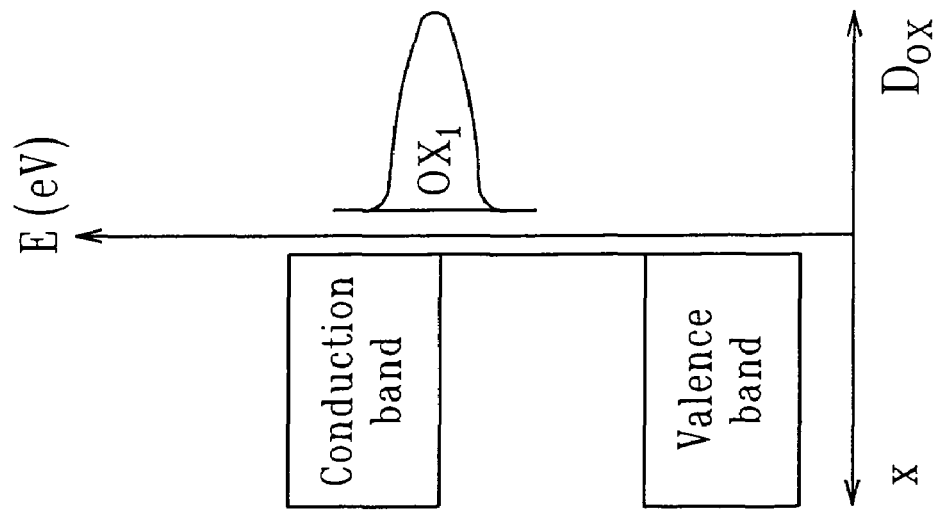
FIGS. 1A-1C show schematic illustrations of electronic configurations for conduction and valence bands in a semiconductor substrate and an oxidant containing solution, with a Gaussian distribution of density of electron states.
Figure 1B:
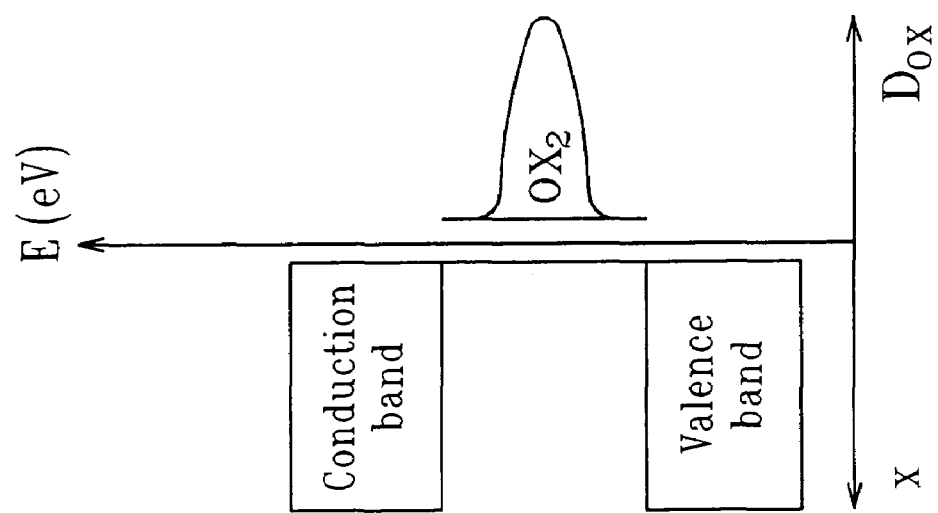
Figure 1A:
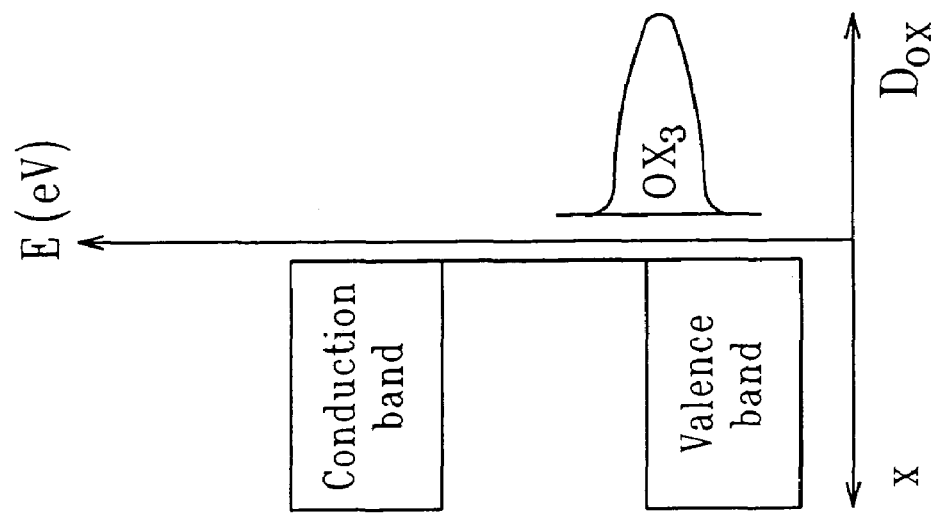

This principle is illustrated schematically in FIG. 1. When empty oxidant states in solution overlap with the electron states of a conduction band of a semiconductor (FIG. 1A), electroreduction of oxidants will be possible at an n-doped substrate (conduction band electrons available) but not at a p-doped substrate (no conduction band electrons available in the dark). Notably, the latter can be made active by illumination to produce photoelectrons in the conduction band. However, when the Gaussian distribution of oxidant states corresponds with energies in the band gap of a semiconductor, no charge transport will be possible and the oxidant can be expected to be inactive at this particular substrate (FIG. 1B). Finally, when oxidant states in solution overlap with the valence band of a semiconductor, charge transfer is possible both for n-doped as well as p-doped substrates (FIG. 1C). However, in the presence of an oxide, charge transfer through the valence band may be hindered. In sum, the electronic structure of the insulator and semiconductor substrate in combination with the electronic structure of the redox electrolyte in solution, generally allow for only certain charge transfer combinations.

Figure 2A:
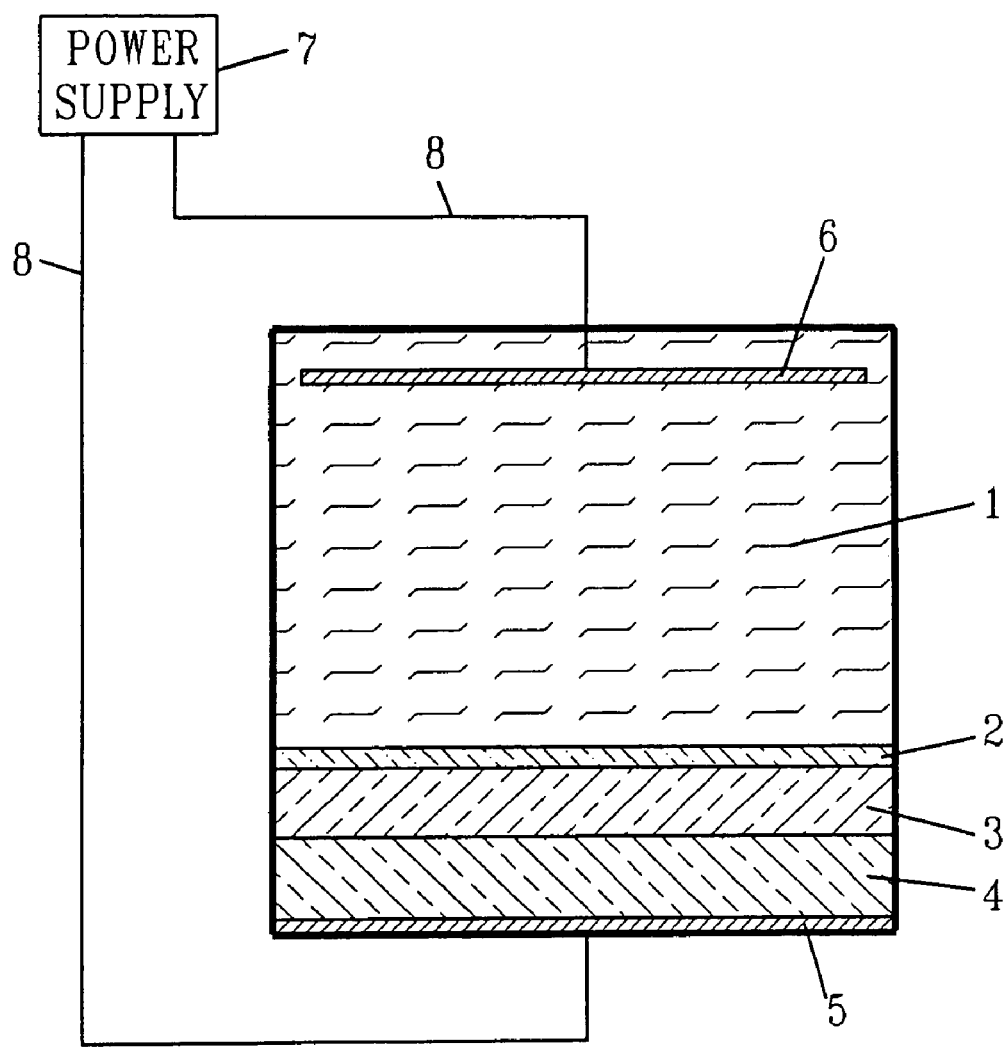
FIGS. 2A-2B show, in cross sectional view, a schematic illustration of blanket electrodeposition using through-gate dielectric current flow.
Figure 2B:
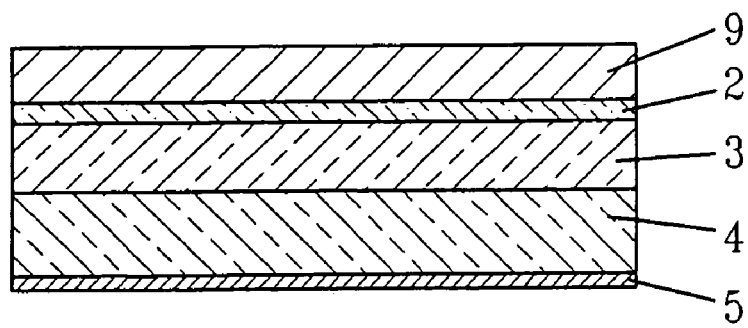

FIGS. 2A and 2B illustrate a contact scheme falling within the scope of the present invention. A dielectric layer (also referred to as an insulating layer or insulator) 2, such as a thin gate oxide, is placed atop one or more substrate layers 3,4 (conducting or semiconducting), such as silicon. Electrical contact 5 is made to at least one of the underlying conducting or semiconducting substrates, such as a backside contact made to the backside of the wafer. If the insulating layer 2 is a semiconductor (such as a wide band-gap semiconductor, for example, n-ZnO, n-TiO$_2$ or n-Ta$_2$O$_5$) for which an ohmic contact scheme is known, an electrical contact can be made directly to the insulating layer. An electrolyte solution or melt 1 is contacted with this layer, either with the wafer front side fully submerged or only submerged in areas where processing is desired. The structure with this layer acts as one electrode and a second auxiliary electrode 6 is introduced in the electrolyte solution or melt. While the (semi)conducting substrate 4 and insulative layer 2 of FIG. 2 are shown as planar, it should be noted that substrate 4 may also have some topography and insulative layer 2 may be a conformal coating.

For electrochemical processing, an electrical bias, voltage or current is applied between both electrodes via a power supply 7 and electrical leads 8. When desired, the electrochemical potential of the structure/electrolyte or structure/melt interface may be controlled more accurately by the introduction of a third electrode, for example, a so-called reference electrode, which has constant electrochemical potential. Examples of reference electrodes include a saturated calomel electrode (SCE) and silver-silver chloride (Ag/AgCl) reference electrodes. FIG. 2B shows the formation of a plated metal film 9 at the structure/electrolyte or structure/melt interface, i.e., directly on the dielectric or insulating layer 2.

Due to the strongly resistive nature of the electron transfer process, electrochemical processing can be expected to occur preferentially on regions that are the most conductive since the current will follow the path of least resistance. In this regard, direct electrochemical processing by current transport through an insulator can be described as an extremely selective process. Several factors or parameters may determine the selectivity and include: insulator thickness, type of insulator, underlying substrate, electrolyte solution, physical blockage, light, and other external means. Each of these parameters or factors are discussed below:

Insulator Thickness

Current will preferentially pass in regions with a thinner oxide or insulator. For example, in the case of a thin gate dielectric, such as HfO$_2$, surrounded by a thick dielectric mask, such as SiO$_2$, direct plating will preferentially occur on the thin gate dielectric as illustrated in FIGS. 3 and 4.

Figure 3A:
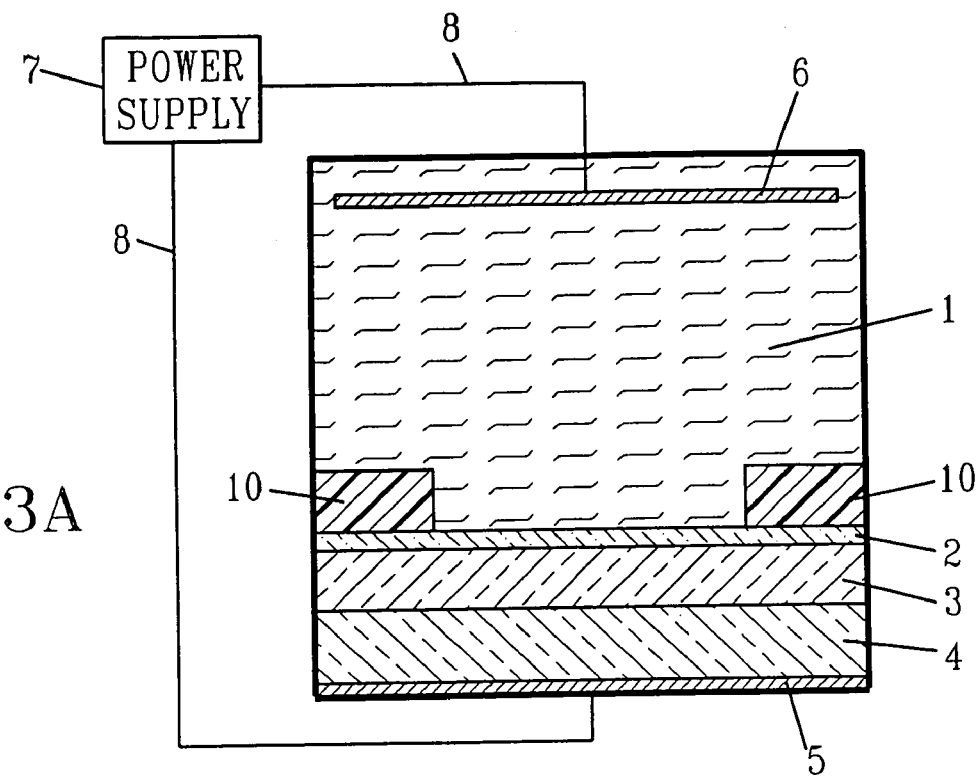
FIGS. 3A-3D show, in cross sectional view, a schematic illustration of through mask plating using an insulating mask.
Figure 3B:
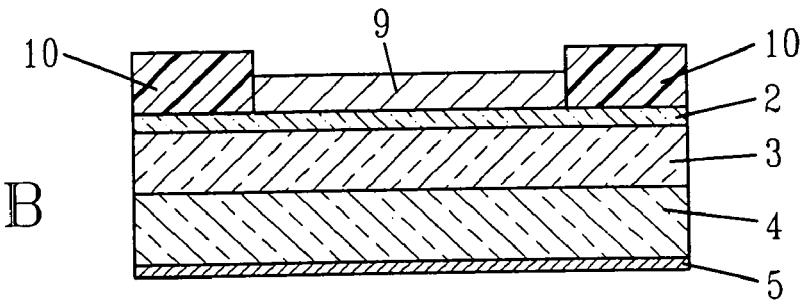
Figure 3C:
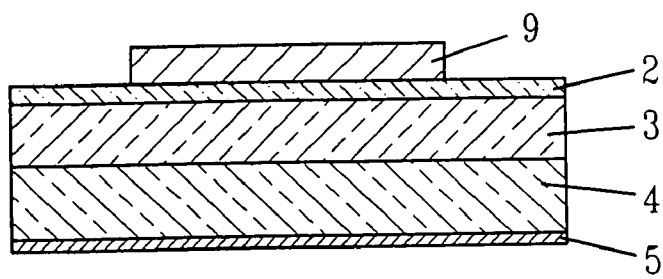
Figure 3D:
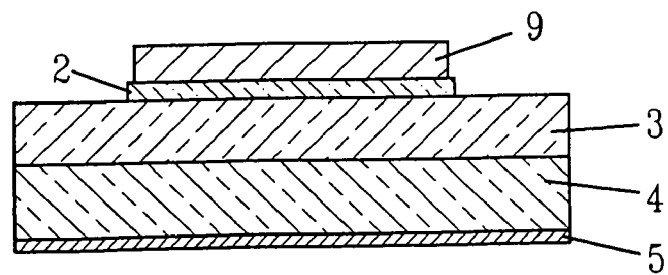

FIGS. 3A-3D show, in cross sectional view, a schematic for through mask plating using a similar setup as described in FIG. 2A with an additional insulating mask 10 on top of the dielectric 2 as shown in FIG. 3A. Plating can be expected to occur only on the exposed gate dielectric inside the mask opening as shown in the resulting structure in FIG. 3B. After removal of the mask 10 a patterned metal structure on top of the gate dielectric is obtained as shown in FIG. 3C. Selective etching of the dielectric provides a patterned metal gate structure as shown in FIG. 3D.

Figure 4A:
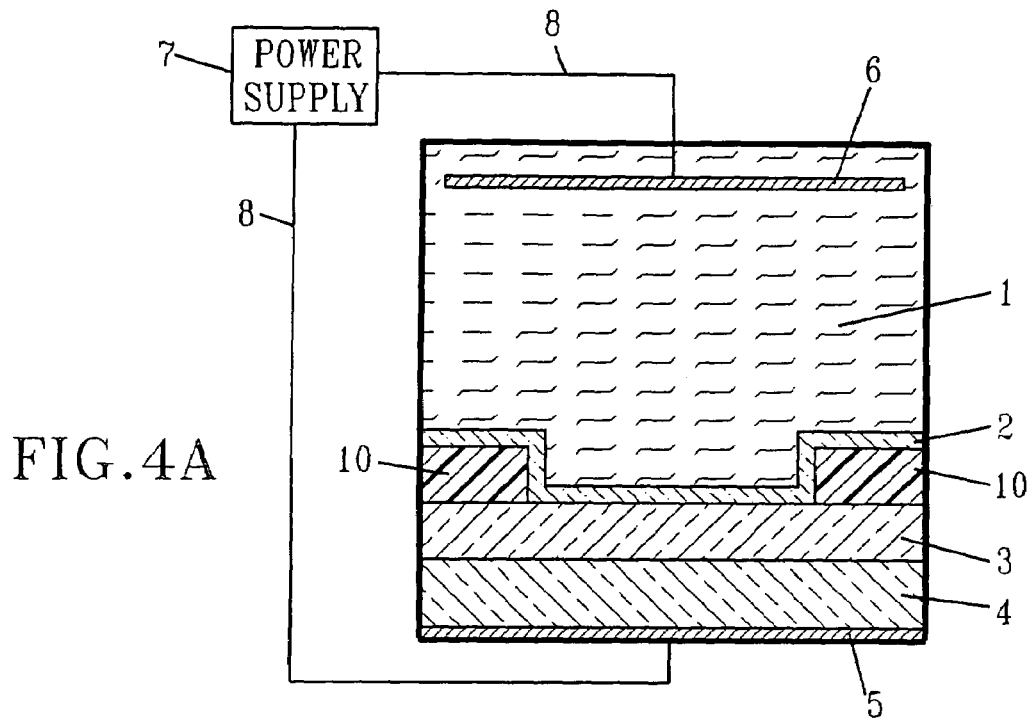
FIGS. 4A-4D show, in cross sectional view, a schematic illustration of through mask plating wherein a gate oxide is deposited over an insulating mask.
Figure 4B:
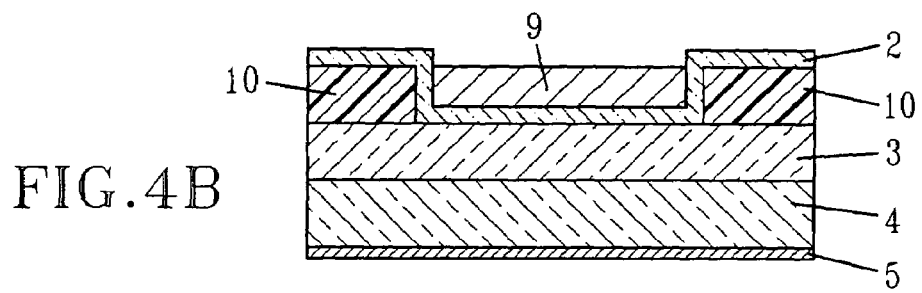
Figure 4C:
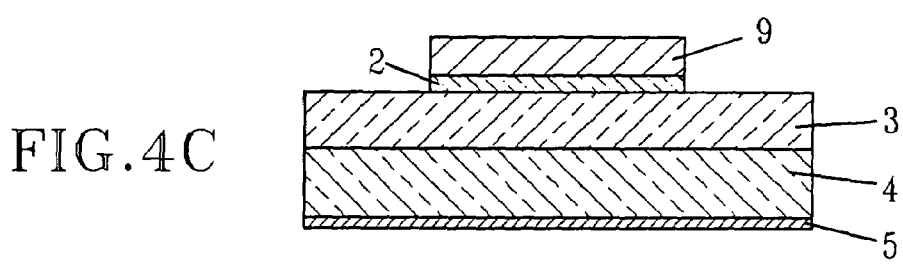
Figure 4D:
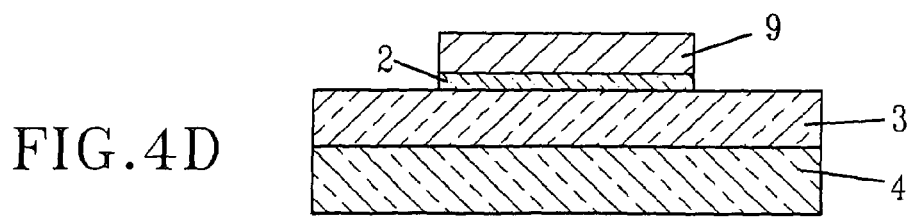

FIGS. 4A-4D show, in cross sectional view, an alternative scheme for through mask plating using a similar setup as described in FIG. 3A, where a gate oxide is deposited over the insulating mask. FIG. 4A shows the setup for electrochemical metal deposition. FIG. 4B shows the structure after metal plating. Removal of the insulating mask together with the gate dielectric in the field results in the patterned metal gate structure shown in FIG. 4C. If required, the electrical contact layer 5 can also be removed leaving the patterned structure shown in FIG. 4D.

Figure 5A:
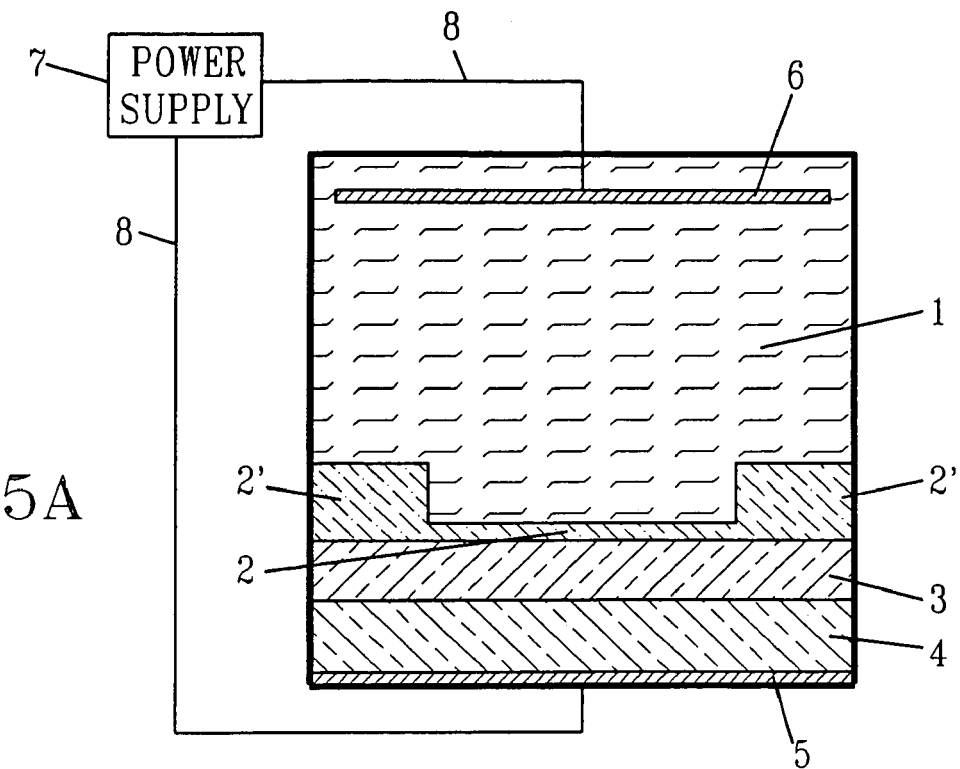
FIGS. 5A-5D show, in cross sectional view, an alternative integration scheme for through mask plating.
Figure 5B:
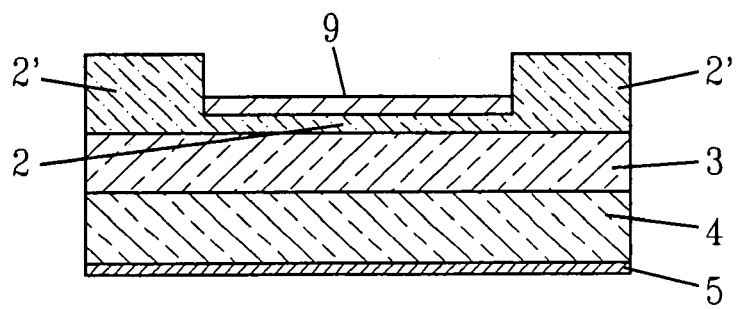
Figure 5C:
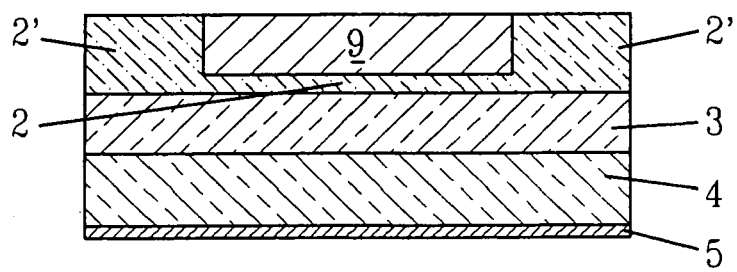
Figure 5D:
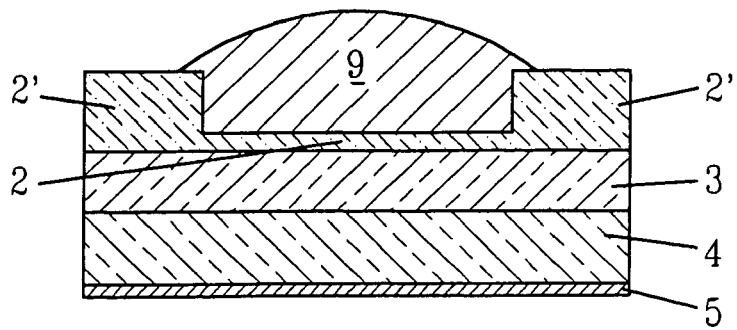

In both cases shown in FIGS. 3 and 4, current will flow through the thin gate dielectric in those regions where no thick dielectric mask is present, irrespective of whether the gate dielectric is underneath or on top of the mask. In this regard, see FIG. 5, which shows an alternative integration scheme for through mask plating, using a similar setup as described in FIGS. 3 and 4, in which case the same dielectric layer 2 has a pattern of thick 2' and thin 2 regions. FIG. 5A shows the setup for electrochemical metal deposition. The required metal can be expected to be electrodeposited selectively in the thin regions, resulting in structures as shown in FIGS. 5B-D, with partially filled (FIG. 5B), completely filled (FIG. 5C), and over-filled (FIG. 5D) metal.

Type of Insulator

Figure 6A:
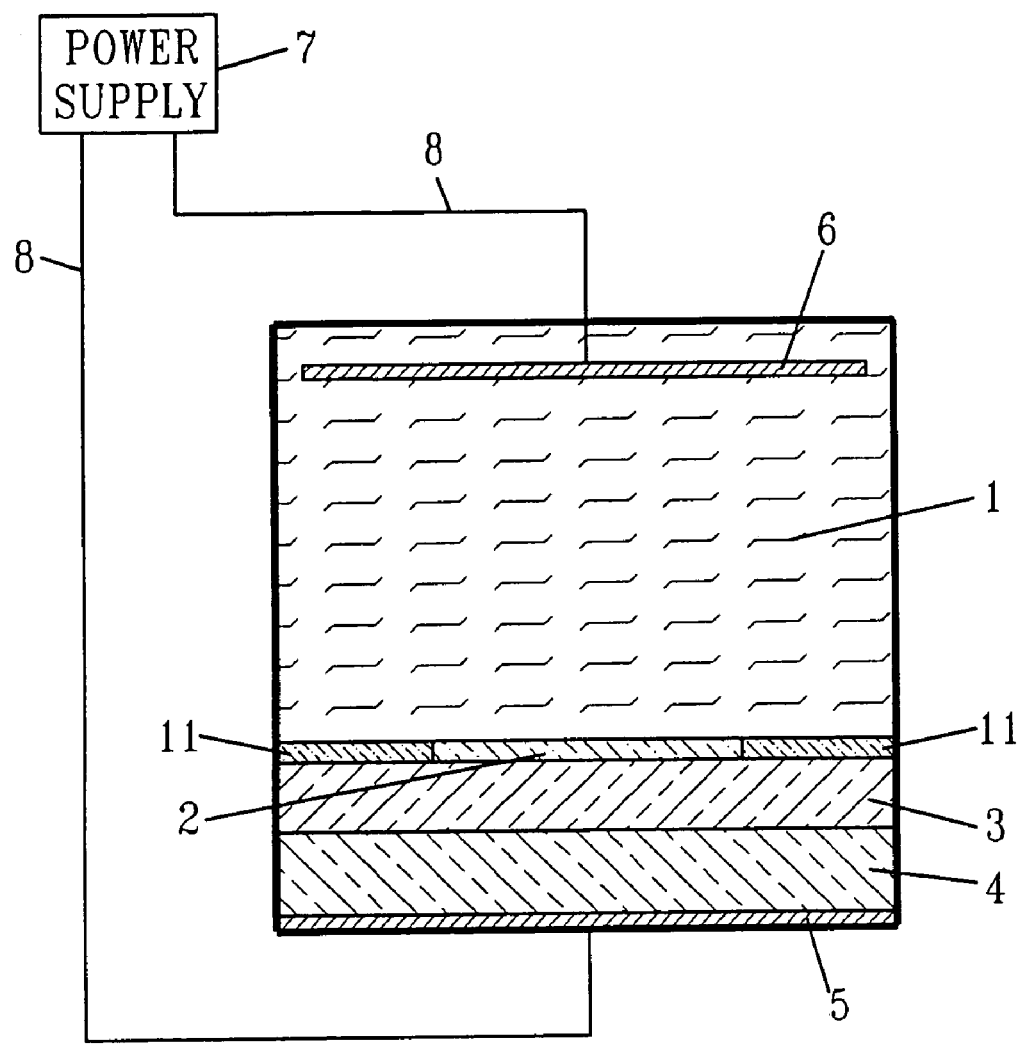
FIGS. 6A-6B show, in cross sectional view, an alternative integration scheme for selective plating without the use of a mask.
Figure 6B:
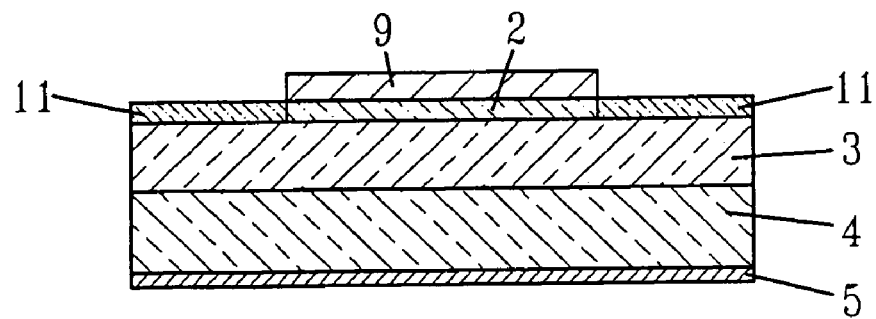

Different oxides or insulators having different dielectric constants or electronic structure, will allow current to flow preferentially at those oxides or insulators which give lower resistance to current flow. In this regard, see FIG. 6, which shows an integration scheme for selective plating, using a similar setup as described in FIG. 2A, without the use of a mask. In this case the dielectric has regions 11 with higher resistance to current flow than the gate dielectric 2. This can be obtained for example by chemical modification of certain areas in the blanket thin dielectric layer. Alternatively, two different dielectric materials (e.g. $HfO_2$ and $SiO_2$) can be put down with the same thickness. Plating can be expected to occur in the regions with lesser resistance to electrical current flow in the solution.

Figure 7:
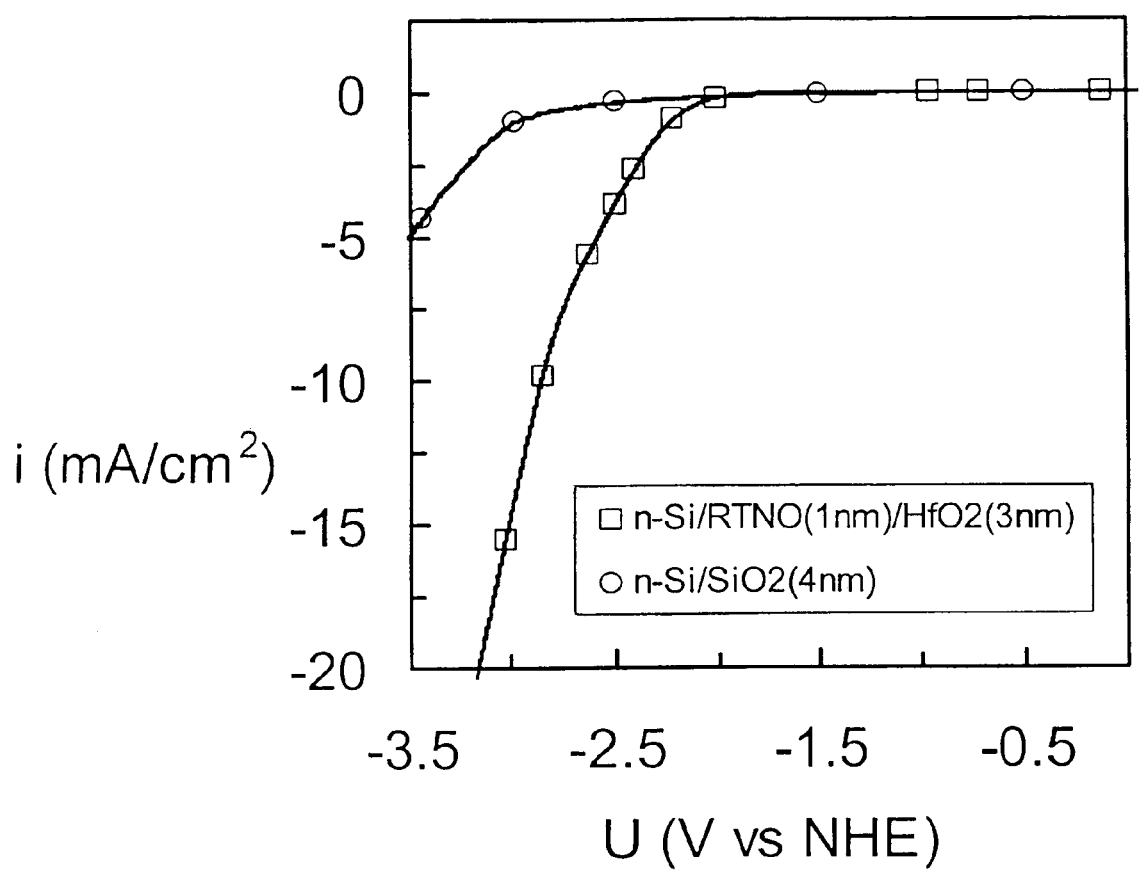
FIG. 7 shows current-voltage curves obtained during a potentiodynamic scan towards negative potentials.

In this regard, see FIG. 7, which shows current-voltage curves in a ruthenium plating bath for n-Si/SiON (1 nm)/ $HfO_2$ (3 nm) and n-Si/$SiO_2$ (4 nm). In FIG. 7, the current density, i, is given in milliamps per square centimeters ($mA/cm^2$) and the electrode potential, U, is given in Volts versus the Normal Hydrogen Electrode (NHE). The scan rate was 50 millivolts per second and the electrode rotation rate was 400 rpm.

As shown in FIG. 7, Ru electrodeposition on the SiON/ $HfO_2$ gate oxide stack starts at −2V, whereas the Ru electrodeposition on a $SiO_2$ layer with the same nominal thickness of 4 nm starts at −2.5V; i.e. electrodeposition will occur preferentially on the SiON/$HfO_2$ stack.

Figure 8A:
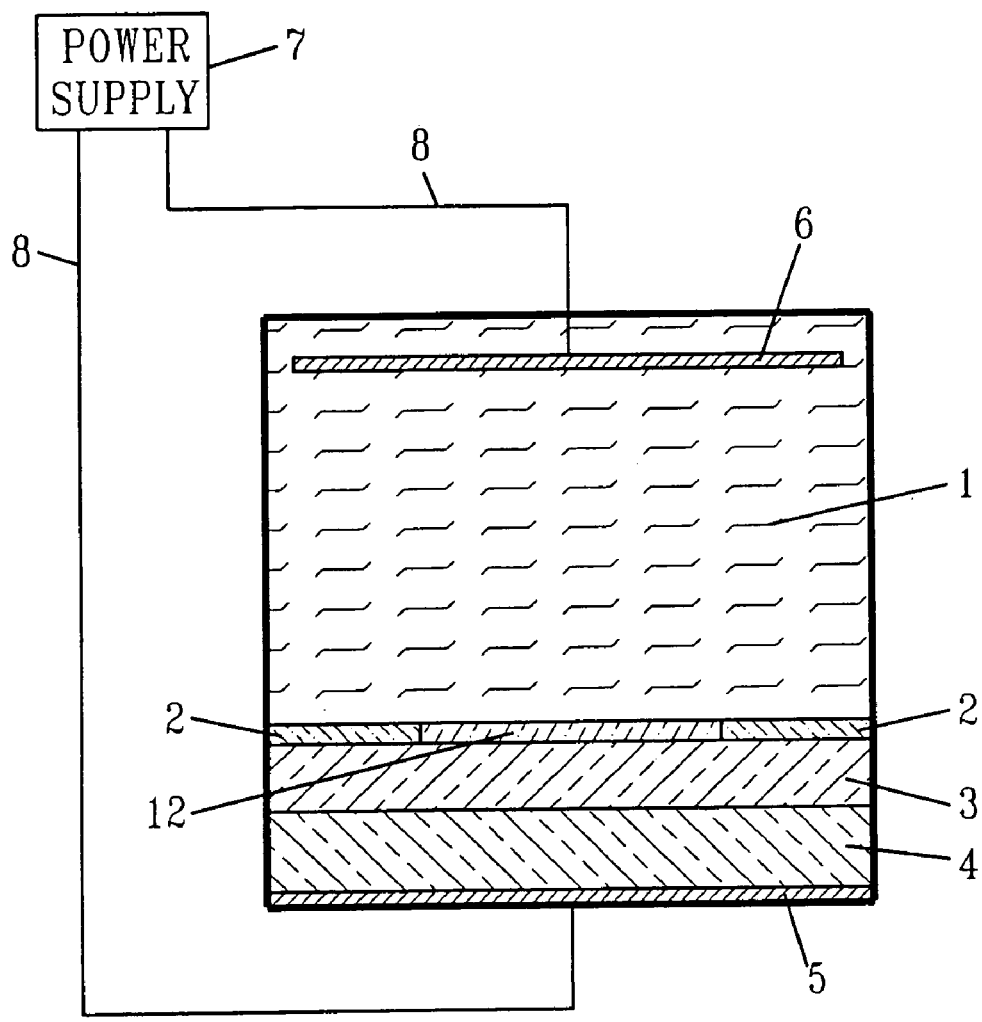
FIGS. 8A-8B show, in cross sectional view, a scheme for selective plating of a metal on a thin dielectric on a patterned area damaged by an incident particle beam.
Figure 8B:
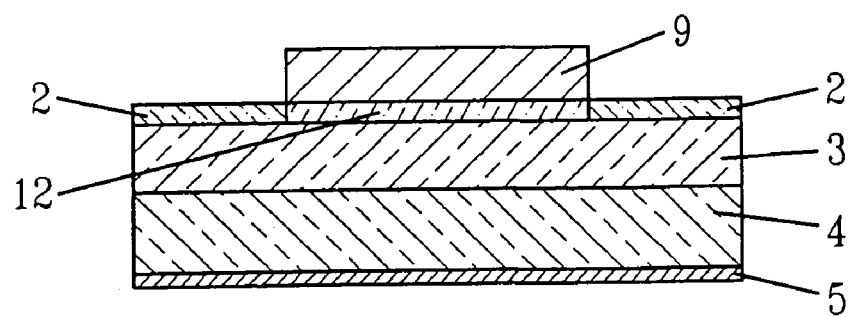
Figure 9A:
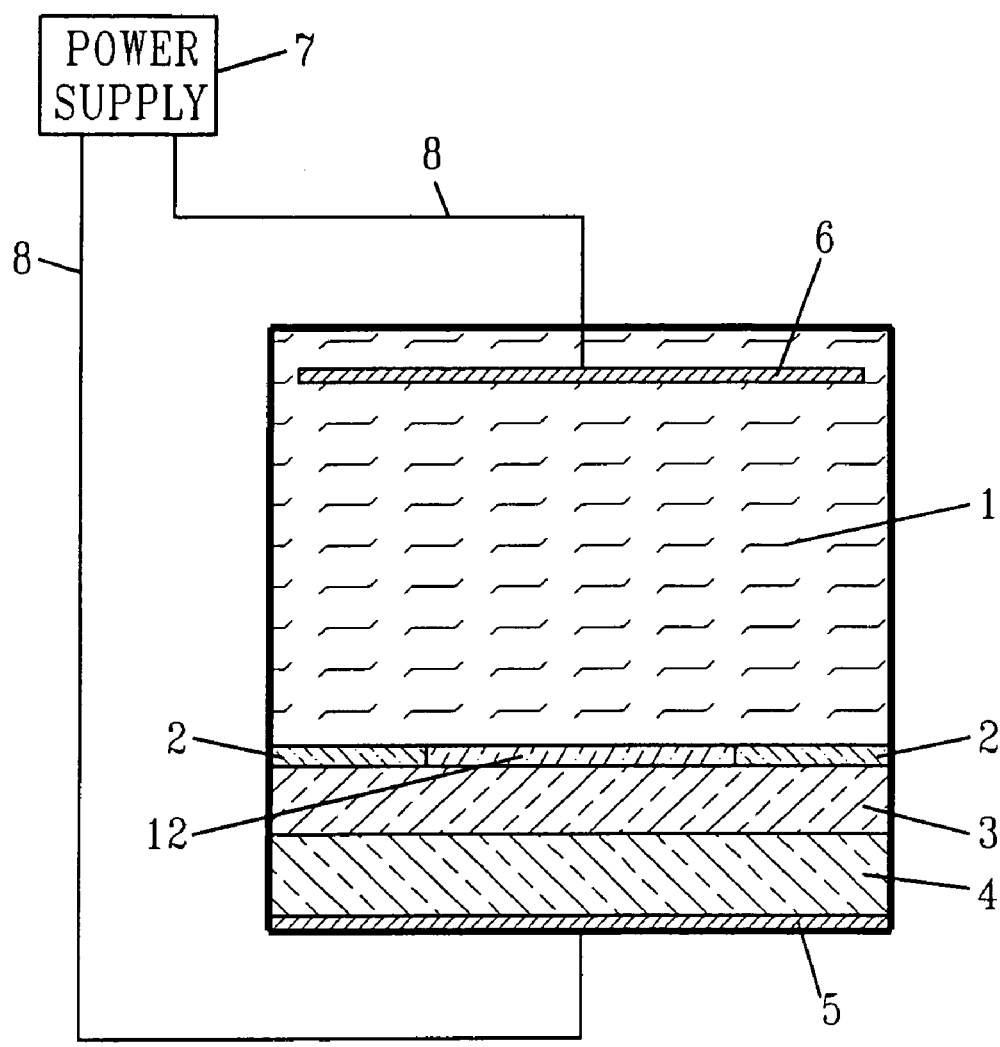
FIGS. 9A-9B show, in cross sectional view, a scheme for selective etching of a patterned area damaged by an incident particle beam.
Figure 9B:
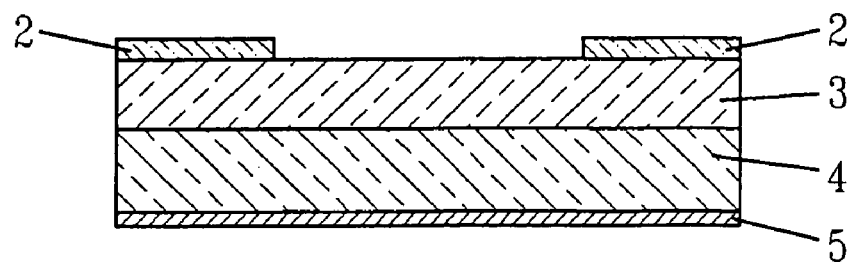

Electrical conductance of oxides generally correlates with the presence of defects and impurities. Accordingly, certain regions of a blanket oxide can be intentionally damaged or implanted to increase their conductivity so that electrochemical processing will preferentially occur in those regions. For example, FIGS. 8 and 9 show selective plating and etching of certain areas of an insulator film after ion implantation or damaging with an ion-or electron beam ("e-beam"). Specifically, FIG. 8 shows a similar setup as described in FIG. 2A, which is patterned with areas damaged by an incident particle beam 12, fabricated by techniques such as e-beam and ion-beam writing. FIG. 8A shows the setup for electrodeposition and FIG. 8B shows the obtained structure. FIGS. 9A-9B show, in cross sectional view, a similar scheme for selective electrochemical etching by through dielectric current flow of a patterned area damaged by an incident particle beam 12 such done with e-beam and ion-beam writing. FIG. 9A shows the setup for electroetching and FIG. 9B shows the patterned structure after electroetching. Through such methods, electrochemical etching of e-beam written patterns in oxide can, for example, eliminate the need of a protective mask used for ion-milling.

Underlying Substrate and Deposition Potential

Current-voltage characteristics, and thus electrode kinetics, are also determined by the makeup of the underlying substrate(s). These characteristics may vary dramatically, for example, according to type of substrate materials used and the type of doping used. Thus, they can be expected to be different for metals, n-type semiconductors, p-type semiconductors, and combinations thereof. For example, electrochemical reduction of metal ions from solution for metal electrodeposition can be achieved either via the conduction band (electron capture process) or the valence band (hole injection process) for n-type semiconductor substrates, whereas electroreduction is only possible via a hole-injection process at p-type semiconductor substrates (in the dark), or when driven into inversion. Since in the present case, a thin dielectric film or gate oxide covers the semiconductor, tunneling of low-energy holes is hindered and charge transport presumably only occurs in or close to electron accumulation mode. In addition, the semiconductor material (including its band-gap and energy of band edges) and the dopant concentration (including its flat band potential and depletion layer thickness) can determine the electrochemical characteristics of the semiconductor/insulator/electrolyte (SIE) contact.

Figure 10:
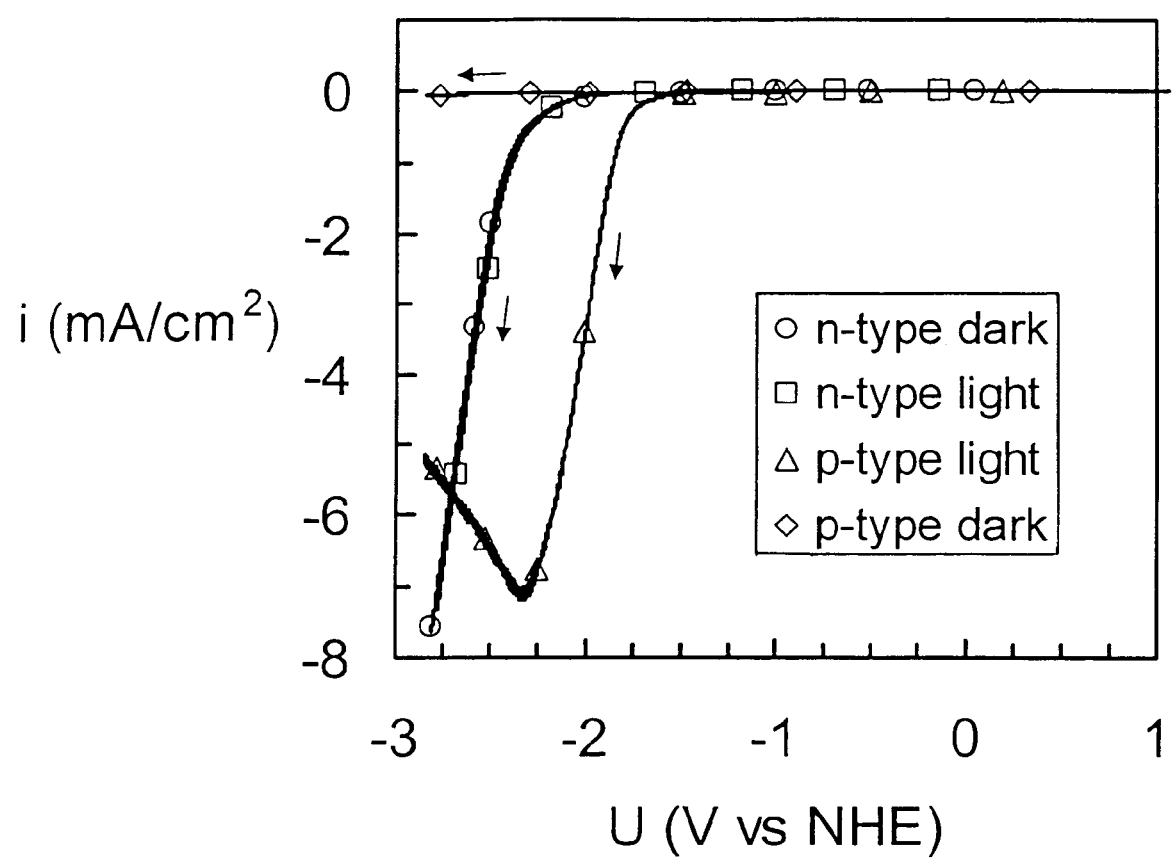
FIG. 10 shows current-voltage curves for n-type and p-type $Si/SiO_2$(1 nm)/$HfO_2$(3 nm) in a nickel sulfate solution in the dark and under white-light illumination.

In this regard, see FIG. 10 which shows the current-voltage characteristics (scanning towards negative voltage) for n-type and p-type Si/$SiO_2$/$HfO_2$ substrates in a nickel sulfate bath (0.1M $NiSO_4$+0.1M $H_3BO_3$) in the dark and under white-light illumination (21V, 150 W halogen lamp) during a potentiodynamic scan towards negative potentials (forward scan). In FIG. 10, the current density, i, is given in milliamps per square centimeter and the electrode potential U is given in Volts versus the Normal Hydrogen Electrode (NHE). The scan rate was 50 millivolts per second and the electrode rotation rate was 250 rpm.

As shown in FIG. 10, the n-type substrate shows an exponential increase of the current at negative voltages past −2V in the dark and under illumination. The p-type substrate does not show any current flow in the dark, and shows a cathodic current for $Ni^{2+}$ reduction below −1.5V, only when the sample is illuminated with white light. This phenomenon allows for the selective plating of n-type and p-type regions simultaneously exposed through mask openings. For example, the n-type substrate can be selectively metallized by electrodeposition in the dark, and the p-type regions can be metallized with another metal of choice by photo-electrodeposition. In the latter case, both the n-and p-type areas are plated (i.e. the metal already deposited on the n-type areas gets another metal coating on top), or by the correct choice of deposition potential, the p-type regions are metallized selectively (no additional plating in n-type regions).

Figures 11A, 11B:
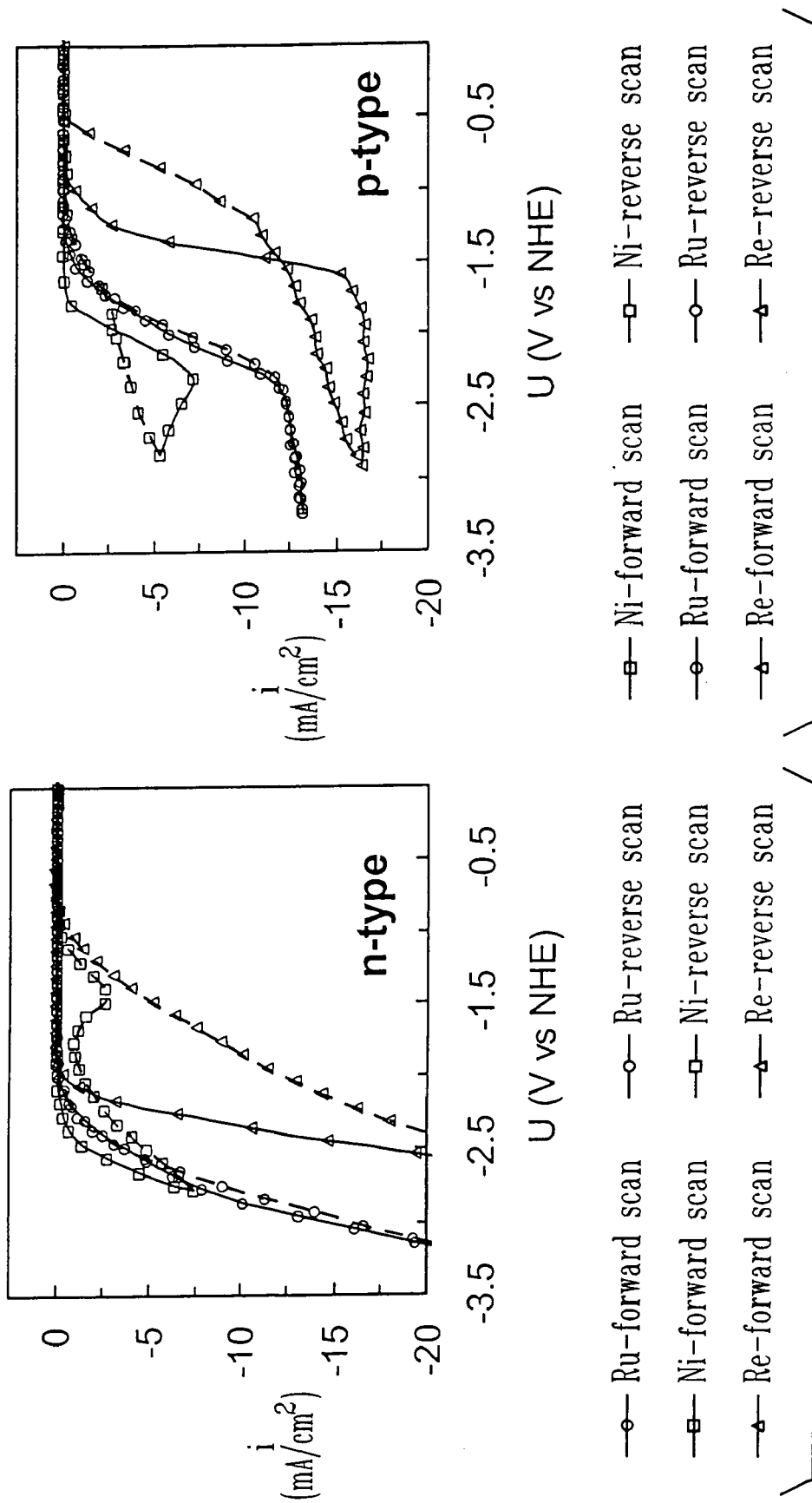
FIGS. 11A-11B show current-voltage curves for n-type $Si/SiO_2$(1 nm)/$HfO_2$(3 nm) (FIG. 11A) and p-type $Si/SiO_2$(1 nm)/$HfO_2$(3 nm) under illumination (FIG. 11B) in nickel sulfate based, ruthenium chloride based, and perrhenate based solutions during potentiodynamic scans towards negative potentials (forward scan) and after reversing the scan direction towards positive potentials (reverse scan)

In this regard, see FIGS. 11A and 11B, showing examples of current-voltages curves (forward and reverse scan) for n-type (FIG. 11A) and p-type (FIG. 11B) Si/SiON(1 nm)/ $HfO_2$(3 nm) under illumination in nickel, ruthenium and rhenium plating baths. In FIGS. 11A and 11B, the current density, i, is given in milliamps per square centimeters and the electrode potential U is given in Volts versus the Normal Hydrogen Electrode (NHE). The scan rate was 50 millivolts per second and the electrode rotation rate was 250 rpm for nickel, 400 rpm for ruthenium and 100 rpm for rhenium.

As shown in FIGS. 11A and 11B, metal deposition on bare n-type substrates starts around −2V for all three solutions in the forward scan (towards more negative potentials) of the current-voltage curves. Upon reversing the scan direction (towards positive potentials), a hysteresis can be seen due to the change from bare to metal covered $HfO_2$, or the formation of the metal gate electrode. Current-flow continues up to about −1.8V for Ru, and −0.75V for Ni and Re. For p-type substrates under illumination (21V/150 W Halogen lamp), metal deposition on bare $HfO_2$ starts at −1.6V for Ni, −1.2V for Ru and −0.9V for Re. Metal deposition continues until −0.9V on Ni and Ru covered HfO$_2$, and until −0.4V on p-Si/SiON/HfO$_2$/Re. Note that for p-type semiconductors, the current becomes limited by the light intensity at sufficiently negative applied potentials. The incident photon flux and thus the measured photo-current are lowered when light is absorbed by the solution and by the deposited metal. The current density for plating at p-type substrates can be controlled by the light-intensity. For example, pulse plating can be done at constant potential by strobing or chopping the light beam. The current-voltage characteristics show the selectivity of metal deposition on n- and p-type substrates. According to the above given example, Ni, Ru as-well as Re could be deposited selectively in the dark on n-type regions at potentials more negative than −2V (by applying constant voltage or constant current). In the case of deposited Ru in the n-type regions, Re and Ni could be deposited selectively at the p-type regions under illumination at potentials between −0.9V and −1.8V for Ni and −1.6V and −1.8V for Re. In the case of deposited Ni and Re in the n-type regions, deposition of Ru, Re or Ni would be expected to occur non-selective or both in the bare p-type regions under illumination and the already metallized n-type regions.

For the fabrication of CMOS devices, p-type silicon substrates are used in many cases. The p-FET gates can be fabricated by doping certain areas' n-type (known as the n-well), whereas the n-FET gates can be formed on the p-type substrate or areas with additional p-doping. In such case, p-n junctions are formed and illumination is desired for electrodeposition on both the p-type area's and the n-well areas (p-n junctions). However, selectivity can be still obtained through differences in the current-voltage characteristics, i.e. the n-well and/or the p-type area's can be metallized selectively at different deposition potentials.

Electrolyte Solution

As discussed above, charge transfer at the solid/electrolyte interface can be expected to occur only between similar electron energy levels. Therefore, the distribution and density of electron states at the electrolyte side can be expected to determine the possibility and kinetics of the electrochemical process. In this regard, it is possible to tune the electron configuration of the electrolyte (e.g. through concentration, complexation, solvent, pH) such that charge transfer is favored at certain substrate/insulator combinations, thus providing selectivity for the electrochemical processing through solution composition. For example, by choosing the solution conditions such that the density of acceptor states in the electrolyte is high in energy and close to the conduction band edge of the semiconductor substrate, electrochemical metal deposition will be expected to be favored at n-type regions as opposed to p-type regions.

Physical Blockage

Selectivity can also be obtained by deactivation of certain regions on the gate dielectric-type oxide by means of physical blockage, i.e. by applying an insulating mask, such as photoresist or SiO$_2$ dielectric, or an adsorbed layer of organic molecules (e.g. strongly adsorbed S-terminated molecules or adsorbed polymer films) applied through typical photo-lithography, e-beam lithography or stamping techniques. In this regard, see FIG. 3, which shows a blocking mask placed on top of a thin dielectric film, blocking the current in the regions with the mask, and allowing current flow in the areas in the mask openings.

Light

In order to allow cathodic conduction band processes at p-type semiconductors and anodic valence-band processes at n-type semiconductor substrates, photon excitation of valence-band electrons over the band gap is necessary. This can be achieved by illumination of the substrate, for example, via illumination through the insulator or from the back-side. Selectivity can be obtained in several ways. For example, careful selection of the light wavelength will activate electrochemical processes only at those substrates or oxides where either the complete band gap can be crossed or interface or gap states can be activated to mediate the electrode reaction. Spatial selectivity may be achieved by using a narrow laser beam to directly write an etched or deposited pattern. Alternatively, a mask can be used to illuminate only certain regions of the insulator surface, by using a light-blocking mask placed in front of the dielectric or disposed on the dielectric.

Figure 12A:
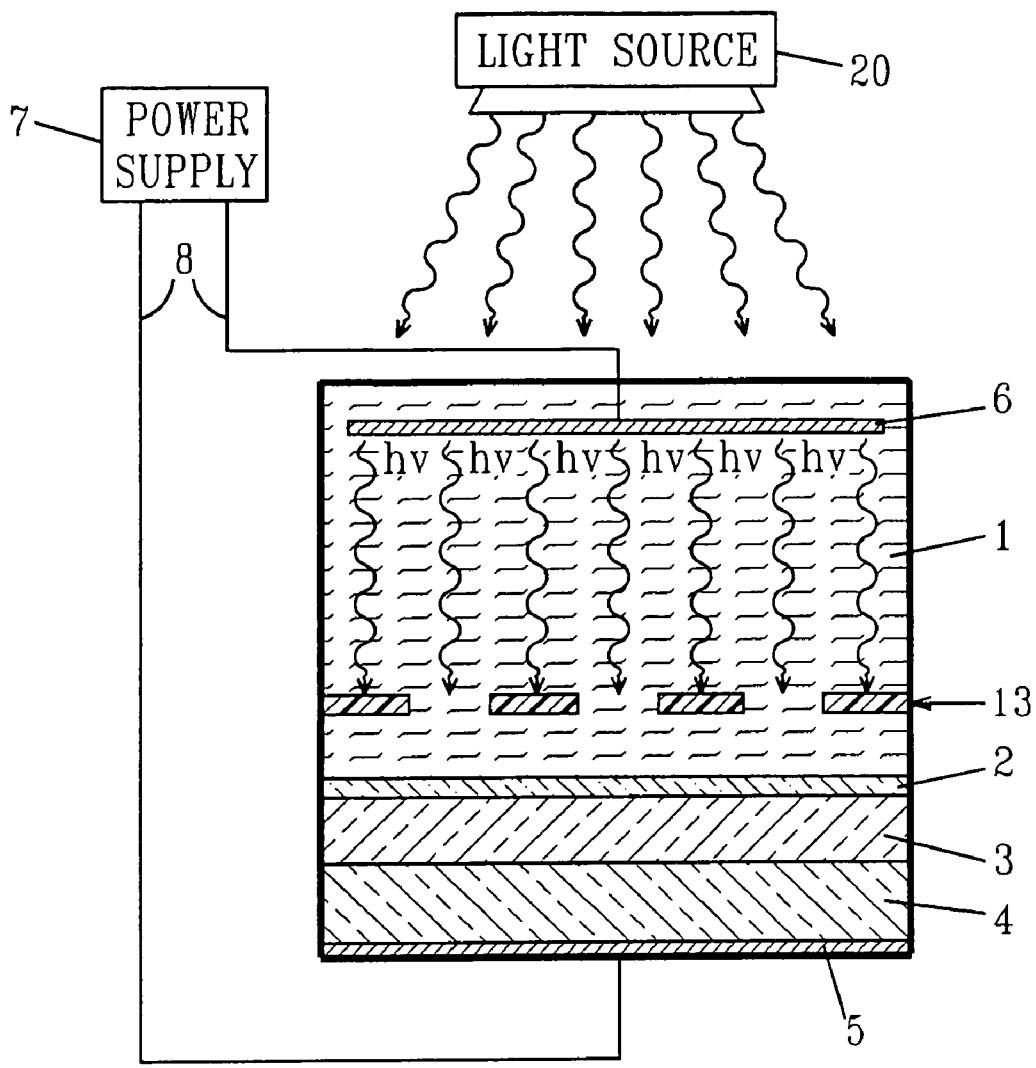
FIGS. 12A-12B show, in cross sectional view, a schematic illustration of the selective photo-electrodeposition of a metal pattern on a blanket gate dielectric by illumination of the substrate through a mask while applying a potential or current.
Figure 12B:
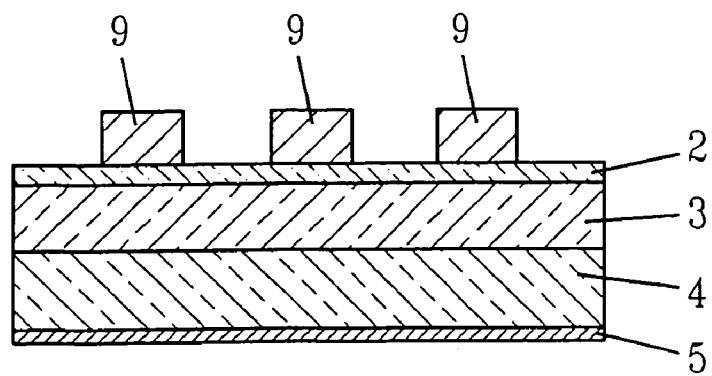

In this regard, see FIG. 12, which shows a similar setup as described in FIG. 2A, but where selective photo-electrodeposition of a metal pattern 9 on a blanket gate dielectric 2 is achieved by illumination of the substrate with a light source 20 through several openings in a mask 13 while applying a potential or current between the substrate 3 and 4, provided with an electrical contact 5 and the auxiliary electrode 6. FIG. 12A shows the setup for photo-electrodeposition and FIG. 12B shows the patterned metal obtained in the illuminated regions which where not blocked by the mask.

In addition, when very high energy sources are used, such as X-ray excitation, conduction band electrons can be generated in the insulator. In addition, other electromagnetic radiation can be used to excite the semiconductor, the oxide or metal.

Other External Means

Selectivity can also be obtained by other external means such as conducting probes or magnetic fields. In this regard, see FIGS. 13A and 13B, which show a similar setup as described in FIG. 2A, but where localized plating occurs underneath an Atomic Force Microscope (AFM) or Scanning Tunneling Microscope (STM) tip 14.

Figure 13A:
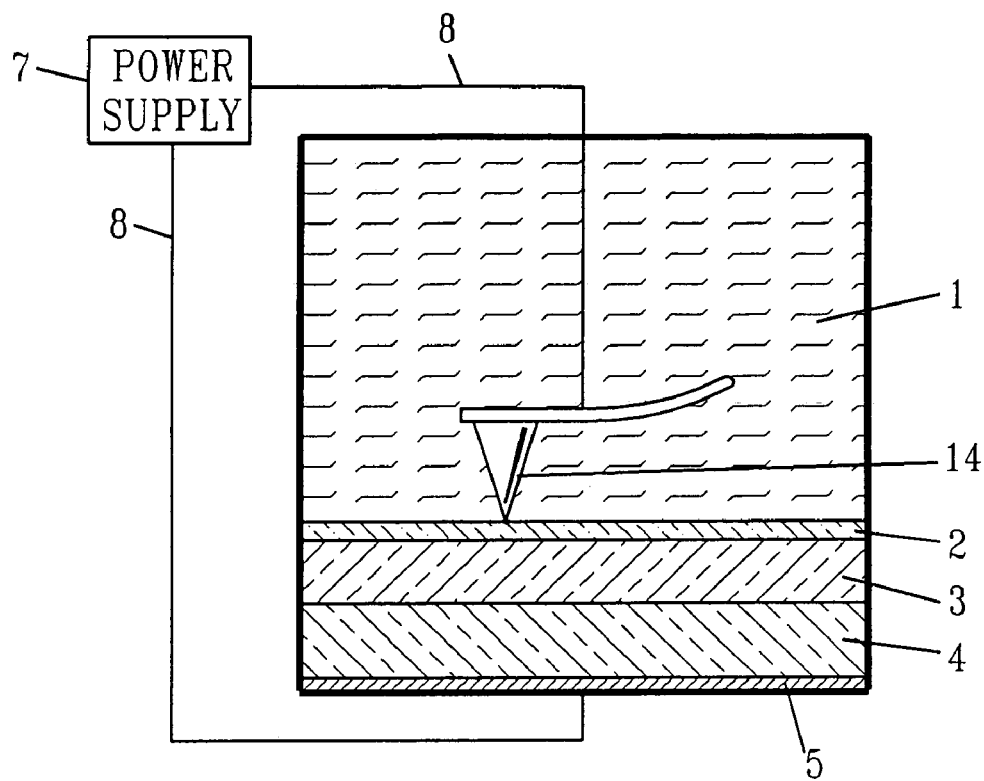
FIGS. 13A-13B show, in cross sectional view, a schematic illustration of selective plating under an AFM or STM tip.
Figure 13B:
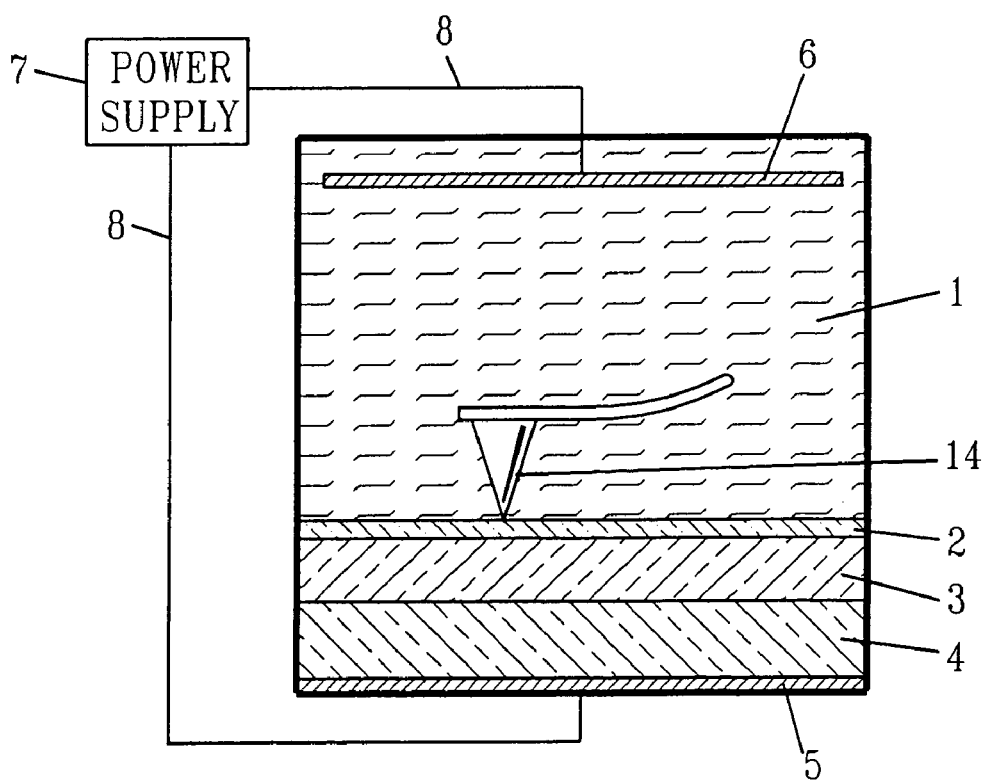

The AFM or STM tip can be conductive and used as a local auxiliary electrode to provide electrochemical processing directly under the probe (FIG. 13A). Alternatively, the tip does not need to be conductive, in which case it can be used in concert with auxiliary electrode 6, whereby the proximity of the tip causes sufficient temporary defects and gap states to allow a current path for electrochemical processing under the tip region only (FIG. 13B). By moving the tip, patterns can be deposited on or etched in the insulator.

As noted above, the present invention can be used to take advantage of strong differences in electrode kinetics at differently doped substrates to achieve selectivity. Within the scope of this invention, a single mask can be used to expose n-FET as well as p-FET gates simultaneously and certain metals can be deposited selectively on different doped substrates.

In one embodiment, a p-FET metal is selectively electrodeposited on an n-type semiconductor area coated with a gate oxide. An n-FET metal can then be put down: (1) selectively in the p-type areas (i.e. by choice of deposition potential); (2) semi-selective by electrodeposition in both the n-type and p-type areas but not on the mask; or (3) completely non-selective by methods such as physical vapor deposition (PVD), chemical vapor deposition (CVD) or atomic layer deposition (ALD) covering the whole wafer, including mask, n-type and p-type areas, with metal or poly silicon.

In another embodiment, an n-FET metal is selectively electrodeposited on a p-type semiconductor area coated first with a gate oxide. A p-FET metal can then be put down selectively in the n-type areas or non-selectively as discussed above.

In another embodiment, a single bath can be developed for the simultaneous formation of n-and p-type field effect transistors (FET). For example, p-FET metals such as Ni, Ru, Rh, Pt and Re have been successfully electrodeposited on $Si/SiO_2/HfO_2$ and $Si/SiO_2/HfSiO$ wafers with about 1 nm of $SiO_2$ and about 3-4 nm of high-k oxide.

Figure 14B:
FIGS. 14A-14B show Focused Ion Beam (FIB) images of an electrodeposited Ru/Ni bilayer structure selectively plated onto $HfO_2$ (3 nm) high-k dielectric.
Figure 14A:

In this regard, see FIG. 14 which shows a top-down view (FIG. 14A) and a cross-sectional view (FIG. 14B) of a Focused Ion Beam (FIB) image of a 1 micron by 1 micron wide and 0.3 micron deep opening in a thick $SiO_2$ mask on-top of an n-$Si/SiO_2$(1 nm)/$HfO_2$ (3 nm) wafer, filled with about 20 nm of electrodeposited Ru and capped by thick electrodeposited Ni. The Ru was electrodeposited at a current density of 10 $mA/cm^2$ for 120 seconds from a $RuCl_3$ based bath at room temperature. The film was annealed at 550° C. in forming gas for 30 minutes. Then, a nickel cap was electrodeposited at 10 $mA/cm^2$ for 120 seconds from a Watts bath at room temperature. Note that the thick nickel cap was deposited for probing the Ru gate for electrical testing, and is not necessarily applied for functional FET devices. In this case, the thick nickel cap also helps illustrate the selectivity since the thin Ru film would be difficult to observe. The thin Ru film was only present within the mask opening and the Ni had grown so that it mushroomed out of the box opening onto the surrounding mask. The backside of the wafer had an As implant (20 keV As; $4\times10^{15}$ $cm^{-2}$, followed by 1000° C. activation anneal for 5 seconds) for ohmic contact.

In yet another aspect of the invention, substrate topography is exploited to produce patterned electrodeposits directly on an insulative layer, without the use of a mask. A thin dielectric layer (e.g., a gate dielectric) is conformally deposited over topography in the substrate. Typical substrate topography might include, for example, depressions in the shape of trenches, via holes, etc., extending below the plane of the substrate's top surface. Blanket electroplating through the dielectric is then performed to fill and overfill the depressions in the substrate topography. Electrodeposited materials above the plane of the substrate's top surface may then be removed by planarization processes known to the art, for example chemical mechanical polishing (CMP), to leave patterned electroplated features in the substrate depressions.

In accordance with the above descriptions, structures with multiple deposited layers fall within the scope of the present invention, as long as at least one electrochemical step, requiring current flow through a thin gate-like dielectric or oxide, is involved. The layers may comprise any material, including metals, alloys, semiconductors, oxides, insulators, polymers, as well as organic and biomaterials.

In addition, the activation or seeding of the high-k dielectric can take place. For example, to obtain better nucleation during electrochemical metal deposition on a dielectric surface, a palladium activation step, typically used for electroless plating processes, can be introduced. Notably, in electroless plating, a Pd catalyst is considered necessary to start the autocatalytic electroless metal deposition. However, in such case, the Pd-clusters are used as nucleation sites for the electrochemical metal deposition with current flow through the gate dielectric. Even though the Pd will typically cover the whole surface including the mask surface, current can be expected to flow only through the thin gate-like dielectric and metallization can be expected to occur only at those Pd sites located on the thin dielectric. Furthermore, even though the Pd activation step facilitates the electrodeposition and benefits film adhesion and uniformity in certain cases, it can also be expected to determine the electrical properties of, for example, the metal gate.

In this regard, an experiment was carried out where Ni was electrodeposited in patterned $SiO_2$-mask (mask openings ranging from 1 um by 1 um to 400 um×400 um) onto n-Si/SiON(1 nm)/$HfO_2$(3 nm) using a Pd activation step. The samples were immersed in a solution of $SnCl_2$ for 5 minutes (1 g $SnCl_2$+40 ml HCL (38 wt. %)+120 ml water), followed by immersion in a $PdCl_2$ solution for 5 minutes (0.1 g $PdCl_2$+40 ml HCl (38 wt. %)+120 ml water). The samples were then loaded in the electrochemical cell for Ni electrodeposition from a Watts bath (300 g/l $NiSO_4$+30 g/l $H_3BO_3$+30 g/l $NiCl_2$; 110 mA/cm2 for 120 s). The capacitance-voltage (Cp-V) characteristics of the as-deposited sample showed strong p-FET properties with a flat-band potential $V_{fb}$=1.0V, mainly determined by Pd at the $HfO_2$/metal interface, whereas after anneal the C-V curves were shifted more towards mid-gap ($V_{fb}$=0.3 V), more typical for electrodeposited Ni.

Alternatively, a metal seed layer can be put down by physical deposition techniques (PVD, ALD or CVD) before plating through the substrate/dielectric/metal seed stack.

Electrochemical Control of Electrical Gate Properties

In the case where the electrical properties of the obtained structures are the main objective, such as for metal gates, and field-effect transistors (FET), electrochemical conditions can help determine the desired physical properties, such as the flat-band potential ($V_{fb}$) and work function of the metal gate and the threshold voltage ($V_T$) of the FET. For example, for direct electrodeposition of metals onto semiconductors, such as Si, GaAs, and GaP (without gate oxide) in the fabrication of metal/semiconductor Schottky-contacts, it has been shown that the barrier height of the formed diode or Schottky-barrier, is strongly dependent on deposition conditions such as the deposition potential, temperature and electrolyte composition. In this regard, see, for example: A. De Vrieze et al., *Phys. Chem. Chem. Phys.*, 3, 5297-5303 (2001); P. M. Vereecken, et al., *Appl. Phys. Lett.*, 75, 3135 (1999); K. Strubbe, et al., *J. Electrochem. Soc.*, 146, 1412 (1999); and P. M. Vereecken, et al., *J. Chem. Soc.*, Faraday Trans., 92, 4069 (1996), the entire disclosures of which are incorporated herein by reference.

The difference in the obtained barrier height, in most cases, is due to slight differences in composition at the metal/semiconductor interface, which are determined by the electrode potential and the composition and pH of the electrolyte. Also, in the case of gate oxides, slight modifications of the metal/gate oxide interface can be expected to be reflected in the electrical properties. In view of these principles, it is possible to control the electrical properties by the electrochemical conditions used. Direct electrochemical modification of the gate oxide is one possibility and is discussed below. In addition, the properties of the metal/gate oxide interface can be controlled in-situ during metal deposition by, for example, the deposition potential, the deposition current and the solution composition (pH, metal ion concentration and additives).

In this regard, see FIG. 18A, discussed below in detail, showing the capacitance-voltage characteristics ($C_p$-V) for Re/$HfO_2$/SiON/Si gates fabricated by Re electrodeposition on n-type Si/SiON(1 nm)/$HfO_2$(4 nm) from ammonium perrhenate solutions with different concentrations of Re in solution. The electrical properties of the Re gates can be tailored by the Re concentration in solution. In this regard, a Re gate with both excellent p-FET properties (flat-band potential close to 1V) and good maximum capacitance values ($C_{p,max}$ close to 1.7 microF/cm$^2$) can be obtained for Re concentrations close to 10 g/l NH$_4$ReO$_4$.

Thermal Properties of Directly Electroplated MOS Gates:

A reoccurring problem with metal gates on high-k dielectrics such as HfO$_2$ and HfSiO, deposited by physical vapor deposition (PVD) techniques such as evaporation and magnetron sputtering, and chemical vapor deposition (CVD) techniques, including atomic layer deposition (ALD) and metalorganic chemical vapor deposition (MOCVD) is that the flat-band potential of the metal-oxide-semiconductor (MOS) structure and thus the measured metal work function is not stable at higher temperatures. Where metals such as Ru and Re show excellent p-FET properties (metal work function close to the semiconductor valence band edge) right after deposition, the work function shifts strongly towards the middle of the semiconductor band gap (midgap) after rapid thermal anneal (RTA) in inert atmospheres such as nitrogen. Since during subsequent integration steps a 1000° C., RTA is necessary for activation of the implanted source and drain regions, p-FET metals with stable work functions are required. It was discovered that metal gates directly electroplated on the high-k dielectric by through-gate-stack electrical current flow, are able to keep p-FET properties even after anneal at elevated temperatures.

Figure 19:
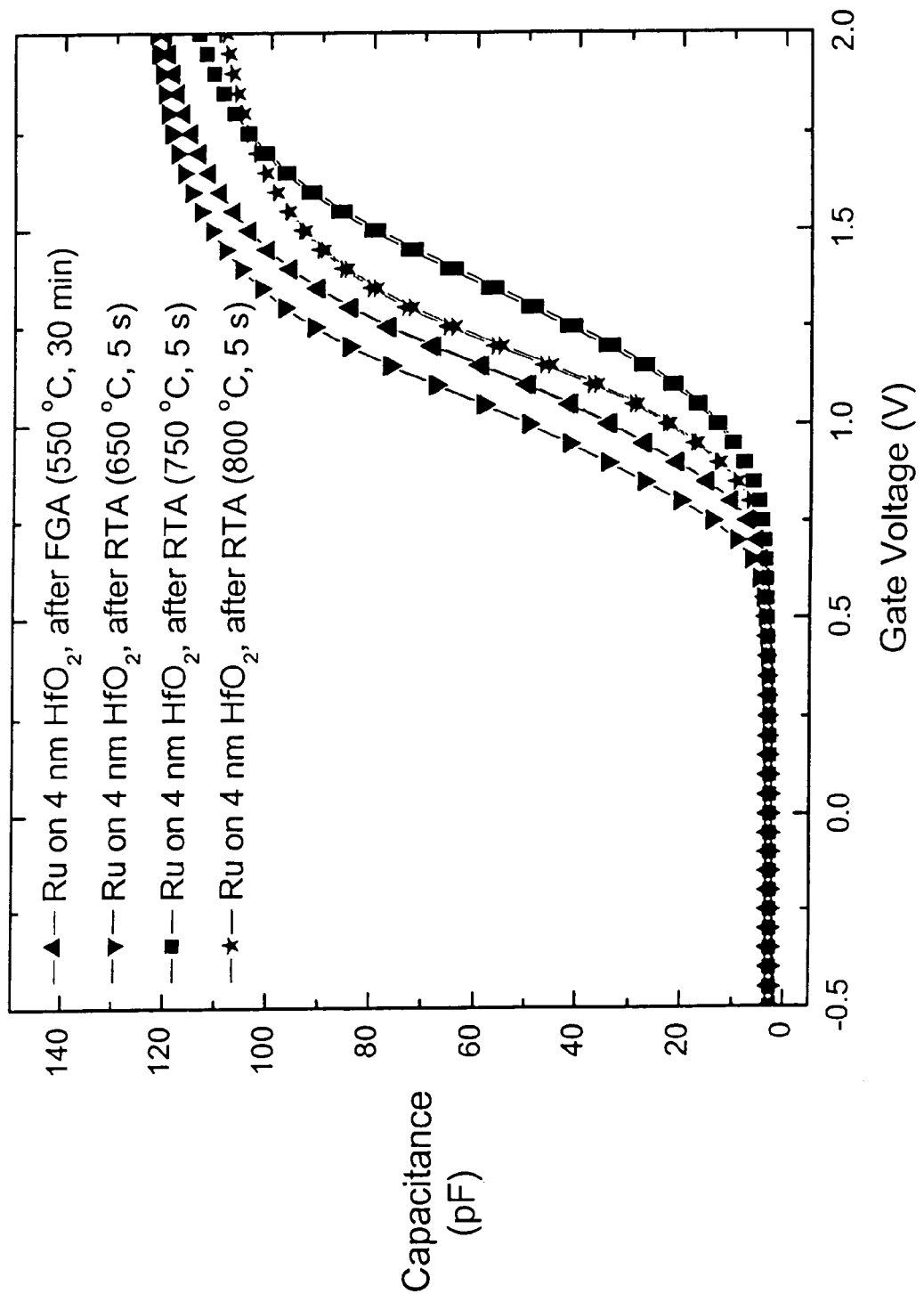
FIG. 19 shows capacitance-voltage ($C_p$-V) characteristics for electrodeposited p-FET Ru/HfO$_2$/SiON/Si MOS test structures (100 micrometer by 100 micrometer), fabricated by galvanostatic deposition (10 mA/cm$^2$ for 120 seconds) from RuCl$_3$ based plating solution and subsequently annealed in nitrogen gas (RTA at different temperatures for 5 seconds) and in forming gas (550° C. for 30 minutes).

In this regard, see FIG. 19, showing the capacitance-voltage characteristics of several Ru/HfO$_2$/SiON/Si MOS test structures (100 micrometer×100 micrometer) fabricated by selective electrodeposition of Ru on n-Si/SiON(1 nm)/HfO$_2$(3 nm) in a RuCl$_3$ based bath (10 mA/cm$^2$ for 120 s, 400 rpm). After deposition, the test structures were annealed at different temperatures under nitrogen (5 second RTA). For comparison, a test structure anneal in forming gas (FGA) at 550° C. for 30 minutes is shown. Apart from a systematic spread sample to sample, the MOS kept excellent p-FET properties up to 800° C.

In processes falling within the scope of the present invention, electrical contact can be made to a conducting or semiconducting substrate, such as Si, by a back-contact arrangement. In addition, electrical contact to the underlaying conductive substrate can be made anywhere on the wafer or device, for example through an opening in an oxide layer. A conductive or electric pathway from the point of contact to the dielectric on the substrate, may pass one or more interfaces, and provides the electrical current path for the electrochemical process. The electrical contact can, for example, include a dry solid-state contact or wet electrochemical contact.

In order to make a dry solid-state contact to a semiconductor, an ohmic contact must be provided. Such contact is typically created by providing a highly doped surface (about 10$^{19}$ cm$^{-3}$) through implantation of dopant elements or creation of surface defects. Alternatively, certain metals can be applied to the semiconductor surface. For example, metals with low work functions, such as In, can give ohmic contacts for n-type substrates and metals with high work functions can provide ohmic contacts to p-type substrates.

Figure 15:
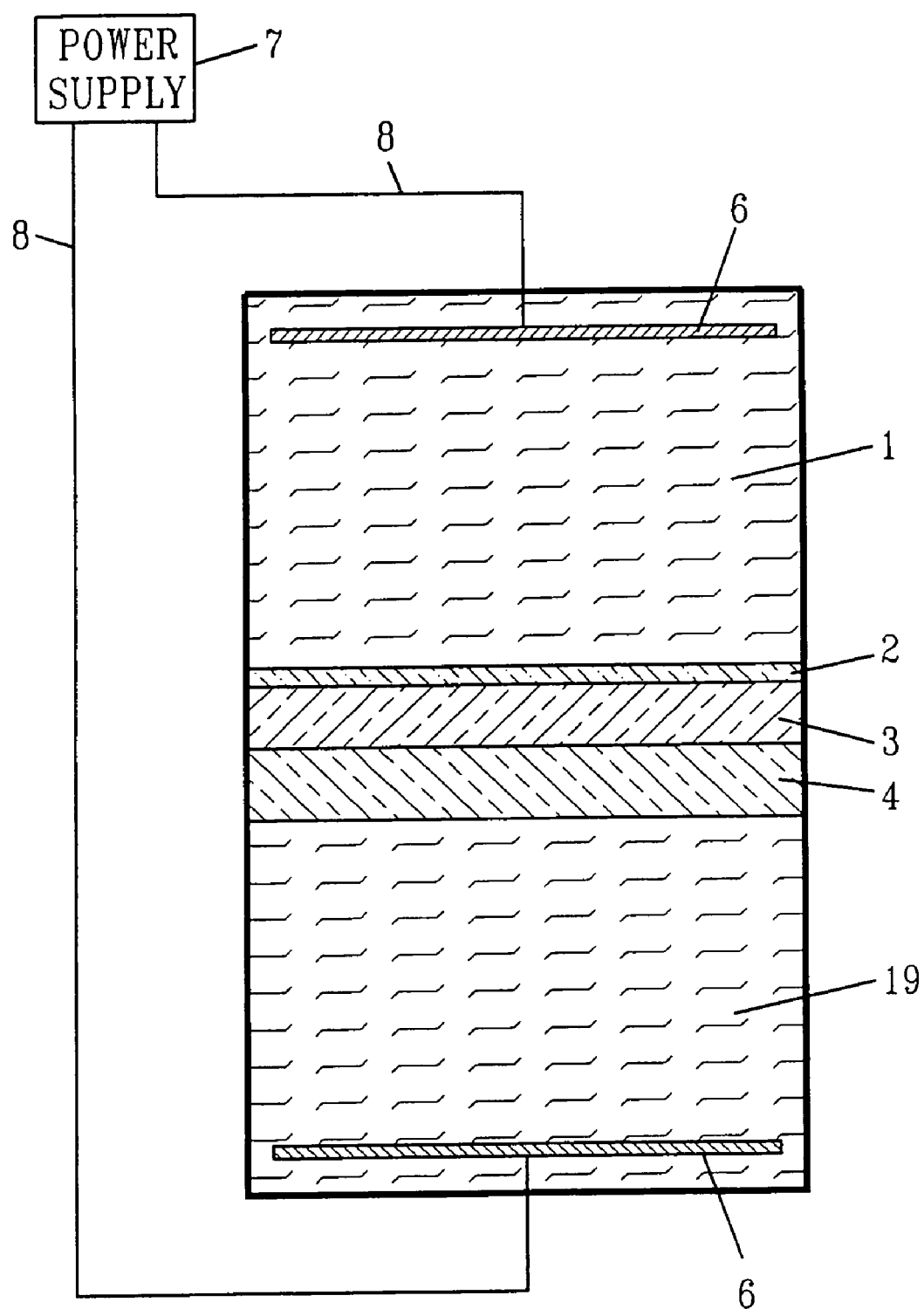
FIG. 15 shows, in cross sectional view, a schematic illustration of a setup for electrochemical processing of a thin gate-like dielectric using an electrochemical back-contact.

For example, application of In—Ga eutectic to Si provides a quick way to make ohmic contact to both n-and p-type substrates. In this regard, FIGS. 2-6, 8-9, and 12-13 are each shown with a dry solid-state electrical contact at the back of the wafer. When the use of a dry contact is difficult due to integration or contamination issues, a wet contact may be used. In this case, the substrate can be contacted by an electrolyte that provides a reversible electrode reaction at the substrate. Since semiconductors typically behave as diodes, suitable oxidizing and reducing agents have to be chosen which preferentially are electrochemically active at the semiconductor valence band, for example, solutions with Fe (III/II), Cu (II/I) and methylviologen MV(II/I). In this regard, see FIG. 15, which shows a schematic illustration for electrochemical processing of a thin gate-type dielectric using a wet electrochemical contact. The workpiece, consisting of thin gate-type dielectric film 2, on-top of one or more substrates 3 and 4, is placed in-between two auxiliary electrodes 6, one acting as the anode and the other as the cathode, with the thin dielectric 2 exposed to solution 1, used for electrochemical processing of the dielectric, and the substrate 4 exposed to the contacting electrolyte 19 proving electrochemical contact. The electrochemical contact is not exclusively made at the wafer backside but can for example be made around the edges of the wafer where the substrate is exposed.

Figure 16A:
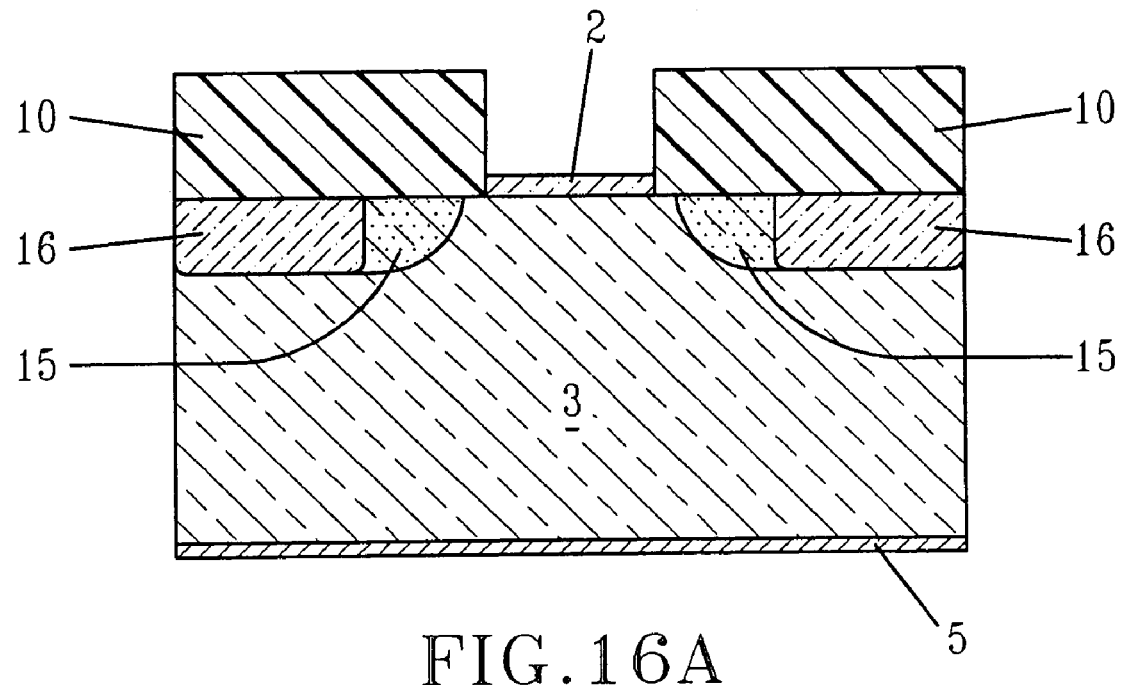
FIGS. 16A-16B show, in cross sectional view, a structure for the fabrication of a metal-gate transistor with an insulating mask exposing a gate oxide, a shallow trench isolator or STI separating the transistors, and source and drain regions.

A contact scheme for current transport through a substrate for the fabrication of n- and p-FET devices is shown in FIG. 16A. In the case of devices build on bulk Si substrates (i.e. without SOI, see below), the current can pass from a back-contact 5, such as an as implanted region to make an ohmic contact, through a conductive substrate 3, to the n- or p-doped region under the gate of the transistor 4, through a gate dielectric 2 into a solution exposed through the insulating mask 10, which is shown above a shallow trench isolator (STI) 16 and source and drain regions 15. FIG. 16A shows the case of bulk silicon devices for which current transport is provided form the electrical contact 5 through the bulk silicon through the gate oxide.

Figure 16B:
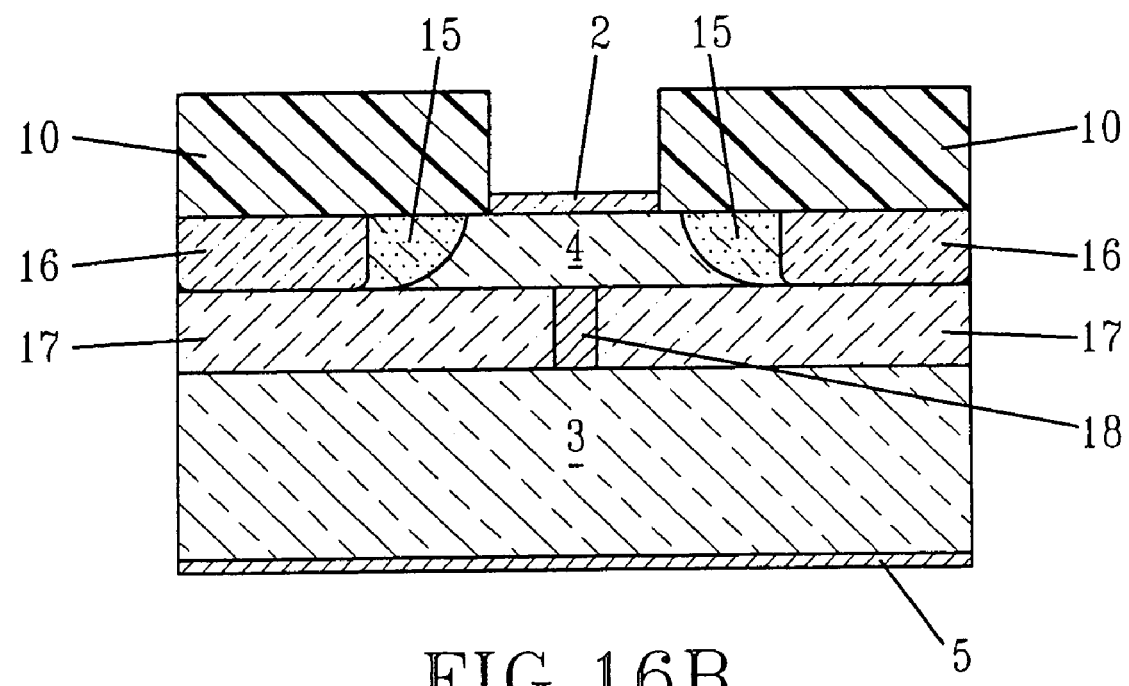

A contact scheme for current transport in the case of silicon-on-oxide (SOI) technology is illustrated in FIG. 16B. In this case, a doped semiconductor, such as Si, SiGe, or Ge for the gate depletion layer is encapsulated in thick insulating material, with a buried oxide ("BOX") 17 below, and insulating shallow trench isolation ("STI") spacers on both sides. In many cases, poly-silicon studs 18 may be present in the BOX as a ground. The Si studs may not be directly connected to the doped semiconductor layer shown directly beneath the gate dielectric, but may actually be connected indirectly through contact with the source and drain regions 15.

While the description above focuses on the direct electrodeposition of metal gates on high-k gate oxides for n- and p-FET's, the invention is not so limited. The scope of the present invention, for example, extends to the electrochemical processing of thin insulators on semiconductor devices, such as electroetching and surface modification, both as separate or integrated process steps. The direct electrochemical processing of gate dielectrics will also have applications beyond CMOS technologies that employ dielectric-semiconductor structures, such as nonvolatile Flash memory. In addition, non-semiconductor applications are covered, for example, the electrochemical processing of insulating materials on metal substrates. Other possible applications include nanostructured transistor devices, in which the semiconductor or metal gate is a nanosized dot or wire, which is selectively plated on an activated region of the oxide (e.g. written by e-beam) or by using an atomic force microscope (AFM) or scanning tunneling microscope (STM) probe. In the case of nanostructured devices, interconnect lines to connect different devices can be formed in a similar manner.

The electrochemical processes encompassed by the present invention include plating of all platable metals, alloys, composites, semiconductors and/or polymers from aqueous, non-aqueous or mixed electrolyte solutions or melts. Applications for direct plating on thin insulator or oxide include MOS-field effect transistors fabricated on thin $SiO_2$ or high-k gate oxides, such as $HfO_2$, HfOSi and $Ta_2O_5$, on underlying n-and p-type semiconductors in combination with a directly electroplated metal gate, such as n- and p-type MOSFET's, or directly plated semiconductor gates. In such cases, examples of methods for selective plating are illustrated schematically in FIGS. 3 and 4.

The applied voltage or current program used to carry out methods falling within the scope of the invention depends on the desired electrochemical process, and can include constant, varying, or pulsed voltages or currents. Accordingly, the current densities necessary to achieve plating in methods corresponding to the invention are not limited and can cover a very broad range. The current densities may, for example, range from about 10 $\mu A/cm^2$ to about 2 $A/cm^2$, depending on the application, the plating process, the plated material and the metal ion concentration in the plating bath. The current densities may typically be expected to range from about 0.1 $mA/cm^2$ to about 100 $mA/cm^2$, such as from about 1 $mA/cm^2$ to about 20 $mA/cm^2$. The voltage depends on the thickness of the oxide or dielectric, its dielectric constant, the plating process, the electrical contact, the tool configuration, and whether or not a reference electrode (third electrode) is used. While not limited, the voltage employed typically ranges from about 0 to about 100 volts, such as from about 0 to about 10 volts, or from about 0 to about 5 volts.

The electrolyte solution used in conjunction with the present invention can be an aqueous, non-aqueous or mixed solvent, or melt, containing metal and non-metal salts, both for solution conductance and as active ingredients. For example, the electrolyte solution can include metal ions for metal deposition, complexing ligands for dissolution during electrochemical etching, impurity sources such as nitrogen compounds, and/or halogens for electrochemical modification of the gate oxide. In certain cases, for example, in electrodeposition of metal gates, impurities or plating additives may be avoided since they may have detrimental effects on the electrical properties of the fabricated metal gate. In other cases, certain impurities may be intentionally added to control the electrical properties by in-situ modification of the high-k/metal interface during deposition.

For instance, for the electrodeposition of noble metals, such as Ru, Re, Rh, Pd and Pt for p-FET metal gate structures, plating solutions with simple compositions such as an inorganic salt of noble metals and an inorganic acid may be used. For example, in the case where the material to be plated is Ru, the electrolyte solution may comprise ruthenium chloride salt and hydrochloric acid. Also commercially available noble metal plating solutions can be used (e.g. Technic Inc., Enthone OMI, Rohm and Haas Electronic Materials L.L.C.).

Plating solutions and conditions may, for example, include metal electrodeposition on $HfO_2$ and HfSiO gate dielectric stacks. In such embodiments, metal films can typically be about 1 nm to about 100 nm thick, such as from about 10 nm to about 50 nm thick. Substrates can, for example, be n-and p-type Si/SiON/high-k and Si/SiO$_2$/high-k, with about 3 nm and about 4 nm $HfO_2$ or HfSiO films (MOCVD). A platinum mesh or sheet can typically be used as an auxiliary electrode, and optionally a saturated calomel electrode (SCE; $Hg/Hg_2Cl_2$;KCl,sat), silver-silver chloride electrode (Ag/AgCl/3 moles/liter NaCl) or saturated mercury sulfate electrode ($Hg/Hg_2SO_4/K_2SO_{4,sat}$) may be used as reference electrodes. A power supply useful for electrodeposition is an Autolab PGSTAT30 potentiostat (Brinkman Instruments) for currents below 1 A, and a KEPCO power supply for higher currents, such as for 200 mm blanket deposition. For metal deposition of p-type substrates, a 21V, 150 W halogen lamp may be used for small samples up to about 20 mm in diameter, and a 120V, 500 W halogen lamp may be used for 200 mm wafers.

Such plating conditions can be used, for example, for the electrodeposition of platinum, rhodium, ruthenium, and rhenium, as will be discussed in more detail below.

Platinum Electrodeposition:

A plating solution comprising $(NH_4)_2PtCl_6$, having a concentration ranging from about 0.001 moles/liter to about 0.1 moles/liter and $Na_2HPO_4$, having a concentration of up to about 1 mole/liter, wherein the solution has a pH ranging from about 2 to about 9 may be used. For example, the plating solution can comprise $(NH_4)_2PtCl_6$, having a concentration of about 0.01 moles/liter, and $Na_2HPO_4$, having a concentration of about 0.4 moles/liter, wherein the solution has a pH of about 7.

In an alternative embodiment, the plating solution can comprise at least one commercially available platinum plating bath, such as the plating baths known as "Platinum TP" and "Platinum AP" from Technic Inc., and "Platanex" from Enthone Inc.

In electroplating processes using the above plating baths, one or more of several methods of applying a current or voltage can be used. These include, for example: application of a constant current between about 3 $mA/cm^2$ and about 50 $mA/cm^2$ or equivalent potentials (electrode potentials of −2V to −3V versus NHE); and pulse plating with a first current between about 5 $mA/cm^2$ and about 250 $mA/cm^2$ for about 20 milliseconds to about 5 seconds, such as about 0.1 second, and a second current of 0 mA up to about 2 mA for about 0.1 seconds to about 10 seconds, including pulse plating with potentials of −2V to 3.5V versus NHE for about 1 cycle up to about 500 cycles, such as about 25 cycles. The temperature during such processing, can, for example, range from about 20° C. to about 90° C. Such processing may occur with or without agitation.

Included within the above processing conditions are those in which there is applied:

(1) a pulse current waveform of about 25 $mA/cm^2$ for about 0.2 seconds, followed by 0 current for about 5 seconds, repeated for about 25 cycles at room temperature at about a 50 rpm rotation rate;

(2) a pulse current waveform of about 25 $mA/cm^2$ for about 0.2 seconds, followed by 0 current for about 5 seconds, repeated for about 25 cycles at a temperature of about 50° C. at about a 50 rpm rotation rate;

(3) a pulse current waveform of about 50 $mA/cm^2$ for about 0.2 seconds, followed by 0 current for about 5 seconds, repeated for 50 cycles at a temperature of about 50° C. at about a 50 rpm rate; and (4) a pulse current waveform of about 250 $mA/cm^2$ for about 0.1 second, and about 10 $\mu A/cm^2$ for about 5 seconds, repeated for 5 cycles at room temperature with no agitation.

Rhodium Electrodeposition:

A plating solution comprising about 1 to about 30 g/l of $Rh_2SO_4$ and about 1 to about 100 ml/l of $H_2SO_4$ may be used. Such solutions may optionally comprise other inorganic constituents (such as bromides, iodides, fluorides, sulfides, sulfates, boric acid, borates and metal salts), organic additives (such as surfactants or brighteners), and/or stress reducers. For example, the plating solution can comprise about 10 g/l of $Rh_2SO_4$ and about 10 ml/l of $H_2SO_4$.

In an alternative embodiment, the plating solution can comprise at least one commercially available rhodium plating bath, such as the plating baths known as "Techni-Rhodium" and Rhodium S-less" from Technic, Inc., and "Rhodex" from Enthone Inc.

In electroplating processes using the above plating baths, one or more of several methods of applying a current or voltage can be used. These include, for example, application of a constant current between about 1 $mA/cm^2$ and about 50 $mA/cm^2$ or equivalent potentials (electrode potentials of $-2$ to $-3V$ versus NHE); and pulse plating with a first current between about 5 $mA/cm^2$ and about 250 $mA/cm^2$ for about 20 milliseconds to about 5 seconds, such as about 0.1 second, and a second current for about 0.1 second to about 10 seconds at 0 mA to about 2 mA, including pulse plating with equivalent potentials ($-2V$ to $-3.5V$ versus NHE) for about 1 to about 500 cycles, such as about 25 cycles. The temperature during such processing can, for example, range from about 20° C. to about 90° C. Such processing may occur with or without agitation.

Included within the above processing conditions are those in which there is applied a current of 25 $mA/cm^2$ for about 0.1 second, followed by a current of about 1 $mA/cm^2$ for about 5 seconds, repeated for about 25 cycles at room-temperature with no agitation.

Ruthenium Electrodeposition:

A plating solution comprising about 1 μl to about 20 μl of $RuCl_3 \cdot xH_2O$, about 1 g/l to about 10 g/l of $NaNO_2$, up to about 40 ml/l of $NH_4OH$ (28 wt %), and up to about 40 ml/l of HCl (38 wt %), wherein the solution has a pH ranging from about 1 to about 9 may be used. The solution may be heated to boiling for about 10 minutes to about 1 hour, turning the solution from opaque black to a clear orange-brown color. For example, the solution can comprise about 5.2 g/l of $RuCl_3 \cdot xH_2O$, about 5.2 g/l of $NaNO_2$, about 8 ml/l of $NH_4OH$, and about 4 ml/l of HCl, wherein the solution has a pH of about 2.3. In addition to $RuCl_3 \cdot xH_2O$, other ruthenium salts can be used, for example, anhydrous ruthenium chloride, ruthenium nitrosyl chloride, ruthenium nitrosyl sulfate, and ruthenium nitrosyl nitrate. In addition, other inorganic constituents (such as bromides, iodides, fluorides, sulfides, sulfates, boric acid, borates and metal salts), organic additives (such as surfactants or brighteners), and/or stress reducers can be added.

In an alternative embodiment, a plating solution comprising about 0.001 moles/liter to about 0.025 moles/liter of $RuCl_3$, up to about 1 mole/liter of HCl, and up to about 1 mole/liter of $H_3BO_3$ may be used. For example, the plating solution can comprise about 0.02 moles/liter of $RuCl_3$, 0.05 moles/liter of HCl, and about 0.4 moles/liter of $H_3BO_3$. In addition to $RuCl_3$, other ruthenium salts can be used, for example, anhydrous ruthenium chloride, ruthenium nitrosyl chloride, ruthenium nitrosyl sulfate, and ruthenium nitrosyl nitrate. In addition to HCl, other inorganic chloride salts can be used. In addition, other inorganic constituents (such as bromides, iodides, fluorides, sulfides, sulfates, borates and metal salts) and organic additives (such as surfactants), and/or stress reducers can be added.

In a further alternative embodiment, the plating solution can comprise at least one commercially available ruthenium plating bath, such as the plating baths known as "Ruthenex" from Enthone Inc. and "Ruthenium U" from Technic Inc.

In electroplating processes using the above plating baths, one or more of several methods of applying a current or voltage can be used. These include, for example: application of a constant current between about 3 $mA/cm^2$ and about 50 $mA/cm^2$ or equivalent potentials (electrode potentials of $-2$ to $-3V$ versus NHE); and pulse plating with a first current between about 5 $mA/cm^2$ and about 250 $mA/cm^2$ for about 20 milliseconds to about 5 seconds, such as about 0.1 second, and a second current for about 0.1 second to about 10 seconds at 0 mA to about 2 mA, including pulse plating with equivalent potentials ($-2V$ to $-3.5V$ versus NHE) for about 1 cycle to about 500 cycles, such as about 25 cycles. The temperature during such processing can, for example, range from about 20° C. to about 90° C. Such processing may occur with or without agitation.

Included within the above processing conditions are those in which there is applied a constant current of about 10 $mA/cm^2$ for about 120 seconds, at room temperature, with agitation at about 400 rpm.

Rhenium Electrodeposition:

A plating solution comprising about 1 g/l to about 100 g/l of $NH_4ReO_4$ and about 1 ml/l to about 250 ml/l of HCl (38%) may be used. For example, the plating solution can comprise about 10 g/l of $NH_4ReO_4$ and about 10 ml/l of HCl (38 wt. %), having a pH of about 1 to about 2. In addition to $NH_4ReO_4$, other perrhenate salts and inorganic Re salts can be used. In addition to HCl, other chloride salts can be used. In addition, other inorganic constituents (such as bromides, iodides, fluorides, sulfides, sulfates, boric acid, borates and metal salts) and organic additives (such as surfactants), can be added.

In electroplating processes using the above plating baths, one or more of several methods of applying a current or voltage can be used. These include, for example: application of a constant current between about 1 $mA/cm^2$ and about 50 $mA/cm^2$ or equivalent potentials (electrode potentials of $-2$ to $-3V$ versus NHE for n-type and $-1.5$ and $-5V$ for p-type); and pulse plating with a first current between about 1 $mA/cm^2$ and about 250 $mA/cm^2$ for about 20 milliseconds to about 5 seconds, such as 0.1 second, and a second current for about 0.1 second to about 10 seconds at 0 $mA/cm^2$ to about 2 $mA/cm^2$ or equivalent potentials ($-2V$ to $-3.5V$ versus NHE for n-type; $-1V$ to $-5V$ versus NHE for p-type) for about 1 to about 500 cycles, such as about 25 cycles. The temperature during such processing can, for example, range from about 20° C. to about 90° C. Such processing may occur with or without agitation.

Included in the above processing conditions are those in which there is applied a constant current of about 10 $mA/cm^2$ for about 120 seconds, at room temperature, with agitation at about 100 rpm.

In other cases, such as the electrodeposition of a protective cap or metal conductor, the bath composition is of less importance and additives for bright deposits can be used. For instance, in the case where the material to be plated is copper, the electrolyte solution may comprise a copper salt, optionally containing a mineral acid, and optionally one or more additives selected from the group consisting of an organic sulfur compound with water solubilizing groups, a bath-soluble oxygen-containing compound, a bath-soluble polyether compound, or a bath-soluble organic nitrogen compound that may also contain at least one sulfur atom.

In general, the insulating layer may comprise single layers, multilayers, and/or mixed layers of metal oxides, metal nitrides, metal oxynitrides, metal carbides, metal borides, including, for example, $SiO_2$, SiN and SiC, and combinations thereof. The dielectric to be deposited can, for example, be selected from the group consisting of a metal oxide, metal oxynitride, metal silicon oxide, metal silicates, metal silicon oxynitride, metal germanate, metal germanium oxynitrides, as well as alloys, mixtures or multilayers of the aforementioned materials. The dielectric may further include interfacial layers of metal-free dielectrics at the substrate interface. Metals, including rare earth metals, that can be used in the above metal oxides, metal oxynitrides, metal silicon oxides, metal silicates, metal silicon oxynitrides, and/or metal germanates can, for example, be selected from the group consisting of Al, Ba, Be, Bi, C, Ca, Ce, Co, Cr, Dy, Fe, Ga, Gd, Ge, Hf, In, La, Li, Mg, Mn, Mo, Nb, Ni, Pr, Si, Ta, Ti, V, W, Y, Zn, and Zr, as well as alloys, mixtures and multilayers of the same.

Typical examples of gate oxides include $SiO_2$, siliconoxynitride (SiON) and $Al_2O_3$. Typical examples of high-k gate oxides include $HfO_2$, HfSiO, $Ta_2O_5$, $La_2O_5$, $ZrO_2$ and $Y_2O_3$. In addition, intrinsic and low doped wide-band gap compound semiconductors, such as SiC and II-VI semiconductors comprising, for example, elements from the group consisting of Cd, Zn, Sr, Se, S and Te, can be used as insulators.

Substrate materials may comprise conductive materials, semiconductor materials and layered combination of the two. Substrates may further comprise buried insulating layers, which may or may not be continuous. Examples of conductive substrate materials include metals, conductive metal oxides, conductive metal sulfides, conductive metal phosphides, conductive metal borides, conductive metal nitrides, conductive metal silicides, conductive metal carbides, conductive polymers, and alloys, mixtures, and multilayers of the same, where the metals are selected from the group consisting of Ag, Al, As, Au, Cd, Co, Cu, Hf, Ir, Ga, Ge, Fe, In, Mo, Nb, Ni, P, Pb, Pd, Pt, Ru, Re, Rh, Se, Si, Sb, Sn, Ta, Ti, W, V, Zn, and Zr. Conductive substrates may, in addition, be selected from conductive polymers, such as polyanyline and Poly(3,4-ethylenedioxythiophene/Poly (strenesulfonate).

Examples of semiconductive substrate materials include doped and undoped group IV semiconductors, for example, Si, Ge, and combinations thereof, and combinations thereof including C. In addition, semiconductive substrate materials may comprise doped and undoped binary, tertiary, and quaternary semiconductors comprising Ga, As, P, Sb, In, Se and Al, such as, for example: GaAs; doped and undoped II-VI semiconductors comprising Cd, Zn, Te, Se, and S; doped and undoped oxide semiconductors, such as $TiO_2$ and ZnO; Cu and Sr based semiconductors; semiconducting or electroluminescent polymers, such as polyacetylene, poly (dialkoxy p-phenylene-vinylene, poly(dialkylfluorene) and their derivatives; semiconductor multilayers and mixed layers; and semiconductor-on-insulator, such as silicon-on-insulator (SOI), strained silicon-on-insulator (SSOI), germanium-on-insulator (GOI) and silicon germanium-on-insulator (SGOI) combinations.

Metals that can be plated according to processes falling within the scope of the present invention may include, for example, those selected from the group consisting of Ru, Re, Ni, Pd, Co, Tc, Pt, Rh, Cr and Mn, and alloys, mixtures, and multilayers of the same. Other metals that may be plated can include, for example, those selected from the group consisting of Os, Ir, Sb, Bi, Sn, In, Fe, Zn, Cd, Se, Te, Cu, Ag, Au, Pb and alloys, mixtures and multilayers of the same, as well as alloys, mixtures and multilayers of any of the above metals with Al, Mg, W, V, Ti, Ta, Mo, Ce, Ga, Gd, Hf, Zr, La, Y, Sr, Ti, Eu, Dy, Ho and Nb. In addition, oxides, sulfides, phosphides, and borides, of any of the above metals may be used, as well as any alloys mixtures or multilayers of any of the above materials with Si, C, Ge, As, O, P, S, and/or B.

Materials that may be plated further include elemental semiconductors such as Si and Ge, which may further include C, H and/or F, and alloys, mixtures, and multilayers of the same. In addition, materials that may be plated include: semiconducting oxides, such as ZnO and $TiO_2$; III-V semiconductors such as InAs, InP, InSb and GaS; II-VI semiconductors such as CdSe, CdS, CdTe, ZnS, ZnSe, ZnTe; and tertiary and quaternary semiconductor compounds of combinations above and with Cu, Sr, Ba, and alloys, mixtures, and multilayers of the same. In addition, materials that may be plated include: conducting oxides wherein the metal is selected from the group consisting of Cd, Sn, Ga, In, Cu, Ru, Re, and Pb, and alloys, mixtures, and multilayers of the same; conducting polymers, for example, polypyrrole and polyaniline; semiconducting polymers; and biominerals.

The final thickness of the material that may be plated, while not limited, may, for example range from about 1 nm to about 100 microns, such as from about 10 nm to about 1 micron, including from about 10 nm to about 50 nm. The thickness of a substrate can, for example, range from about 1 cm to about 0.1 micron, such as from about 1 mm to about 300 μm. The thickness of a gate oxide can, for example, range from about 1 nm to about 20 nm, such as from about 2 nm to about 4 nm.

The amount of plated material deposited will be a function of plating time, and the gate opening can be partially-, fully- or overfilled, as shown in FIG. 5. For example, typical plating times may range from about 0.1 second to about 3 hours, such as from about 10 seconds to about 30 minutes, including from about 10 seconds to about 2 minutes. The formation of the complete gate stack may be combined with other deposition techniques, such as for example, PVD, ALD, and CVD. For example, a first metal layer may be formed atop the dielectric by through-dielectric plating according to the methods of this invention to form the bottom part of the gate electrode, followed by deposition of a second layer to form an upper part of the gate electrode. The second layer may be deposited by electrodeposition, physical vapor deposition, chemical vapor deposition etc., and may be optionally alloyed with the underlaying metal and/or additionally annealed to form the final gate electrode. The materials that may, for example, be used in such a process can include one or more layers of a pure metal or metal alloy, a metal or metal alloy silicide, a metal or metal alloy germanide or a metal-containing conductive oxide or nitride, where at least one of these layers is in contact with the device's gate dielectric. The metal and metal alloying elements may, for example, be selected from the group consisting of Al, Co, Cr, Fe, Ir, Hf, Mg, Mo, Mn, Ni, Pd, Pt, Ir, La, Os, Nb, Rh, Re, Ru, Sn, Ta, Ti, V, W, Y, and Zr, and alloys, mixtures, and multilayers of the same. These layers may also be doped with nonmetallic elements. The metal and alloying elements may be deposited by any method known in the art such as, for example, chemical vapor deposition (CVD), metalorganic CVD (MOCVD), or sputtering. In this regard, deposition, for example, of a semiconductor, such as Si, onto the gate dielectric may be controlled without the need for high temperature step (as opposed to CVD). Accordingly, using methods falling within the scope of the present invention, entirely new routes of interface engineering prior to and during gate deposition may be developed. Such processes may, for example, help prevent interfacial Hf—Si bond formation or may enable in situ doping of the Si during deposition, which may help reduce poly-Si depletion.

Figure 17:
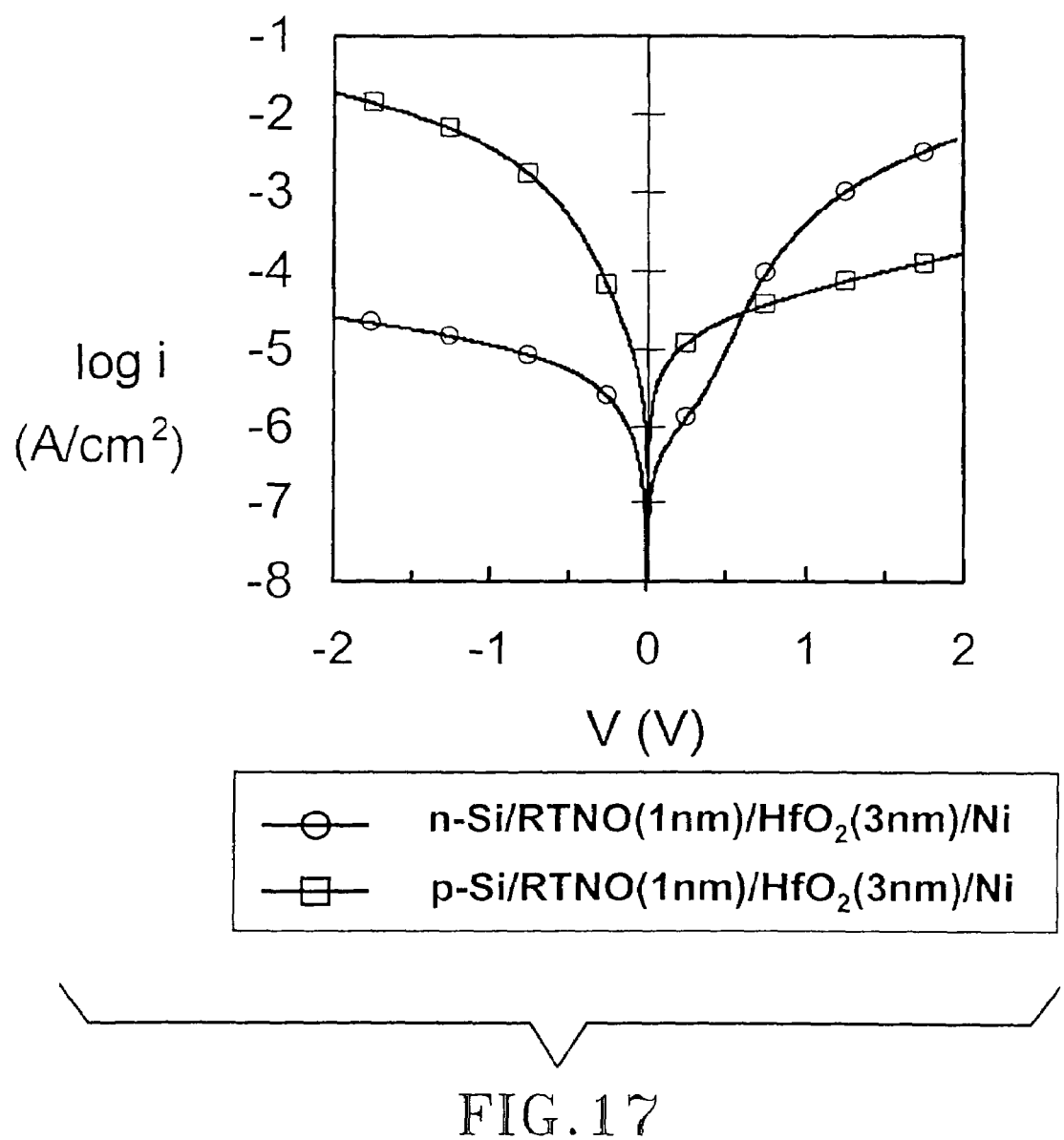
FIG. 17 shows the current-voltage (I-V) characteristics of blanket Ni/$HfO_2$/SiON/Si metal capacitor structures prepared by Ni electrodeposition on n-type and p-type Si/RTNO (1 nm)/$HfO_2$ (3 nm) in 0.1 Moles/liter $NiSO_4$+ 0.25 Moles/liter $H_3BO_3$.

In accordance with the above, an example of blanket metal deposition on a gate dielectric was prepared by depositing Ni on n-type and p-type Si/SiON/HfO$_2$ blanket film. The current-voltage characteristics for the resulting blanket Si/SiON/HfO$_2$/Ni MOS-capacitors are shown in FIG. 17. A typical diode type current-voltage curve or Schottky-type behavior was observed.

In accordance with the claimed embodiments, examples of selective electrodeposition for the fabrication of patterned MOS structures were prepared by electrodeposition of Re and Ru metal in patterned test structures with a thick SiO$_2$ mask, with openings ranging from (1 micrometer by 1 micrometer) to (400 micrometer by 400 micrometer), on-top of a high-k/SiON/Si and high-k/SiO$_2$/Si stack. The high-k material was HfO$_2$ and HfSiO, 3 nm and 4 nm thick prepared by MOCVD. SiON or silicon oxynitride was prepared by rapid thermal oxidation and the SiO$_2$ was a chemical oxide, both 1 nm thick.

Figure 18A:
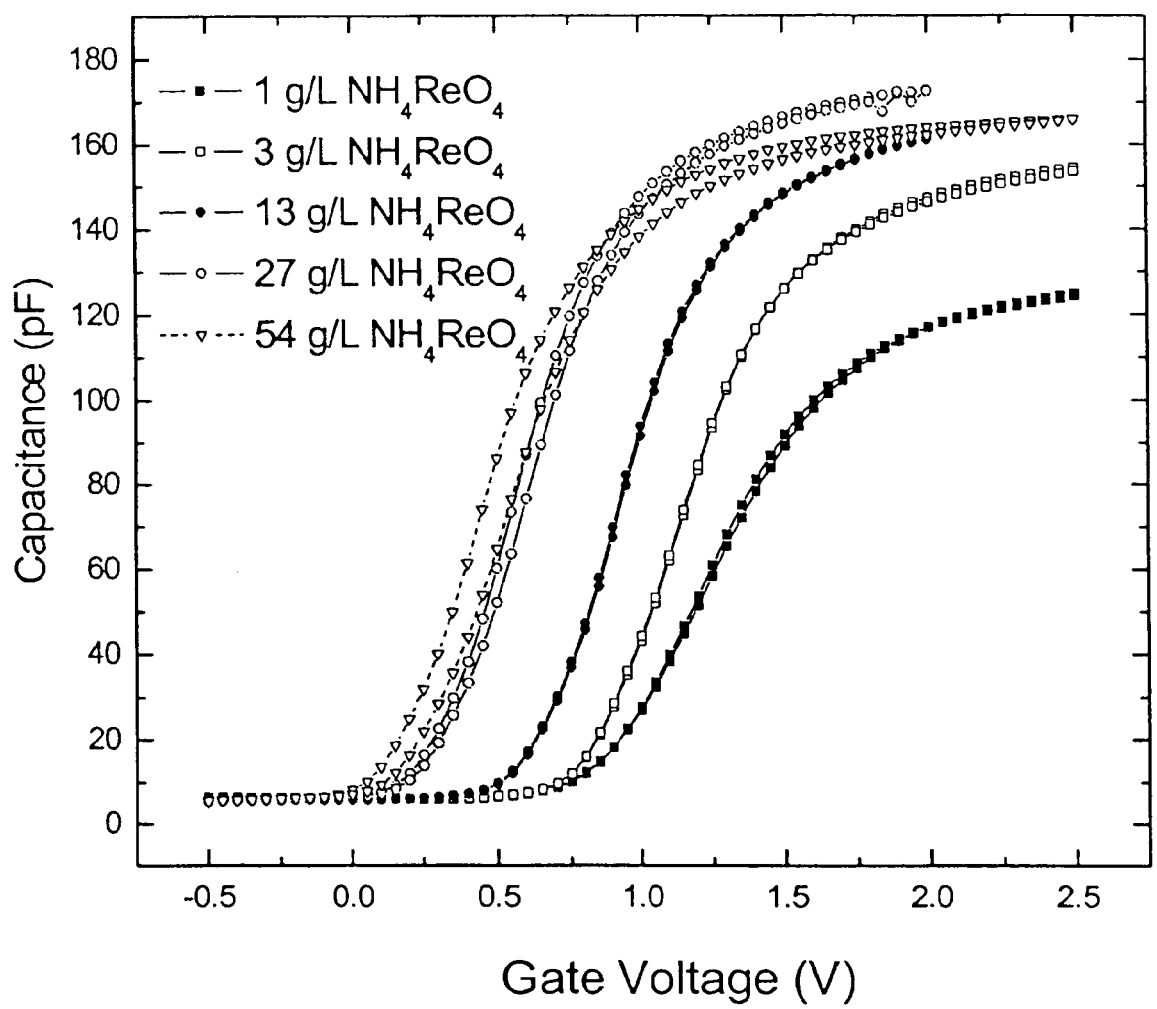
FIGS. 18A-18B show capacitance-voltage ($C_p$-V) characteristics for electrodeposited p-FET Re/$HfO_2$/SiON/Si MOS test structures (100 micrometer by 100 micrometer), fabricated by galvanostatic deposition (10 mA/cm² for 120 seconds) from Re plating solutions with an ammonium perrhenate ($NH_4ReO_4$) concentration ranging from 1 to 54 grams/liter and subsequently annealed in forming gas at 550° C. for 30 minutes for n-type Si/SiON(1 nm)/$HfO_2$(4 nm) substrates (FIG. 18A) and p-type Si/SiO$_2$(1 nm)/HfO$_2$(3 nm) substrates (FIG. 18B)
Figure 18B:
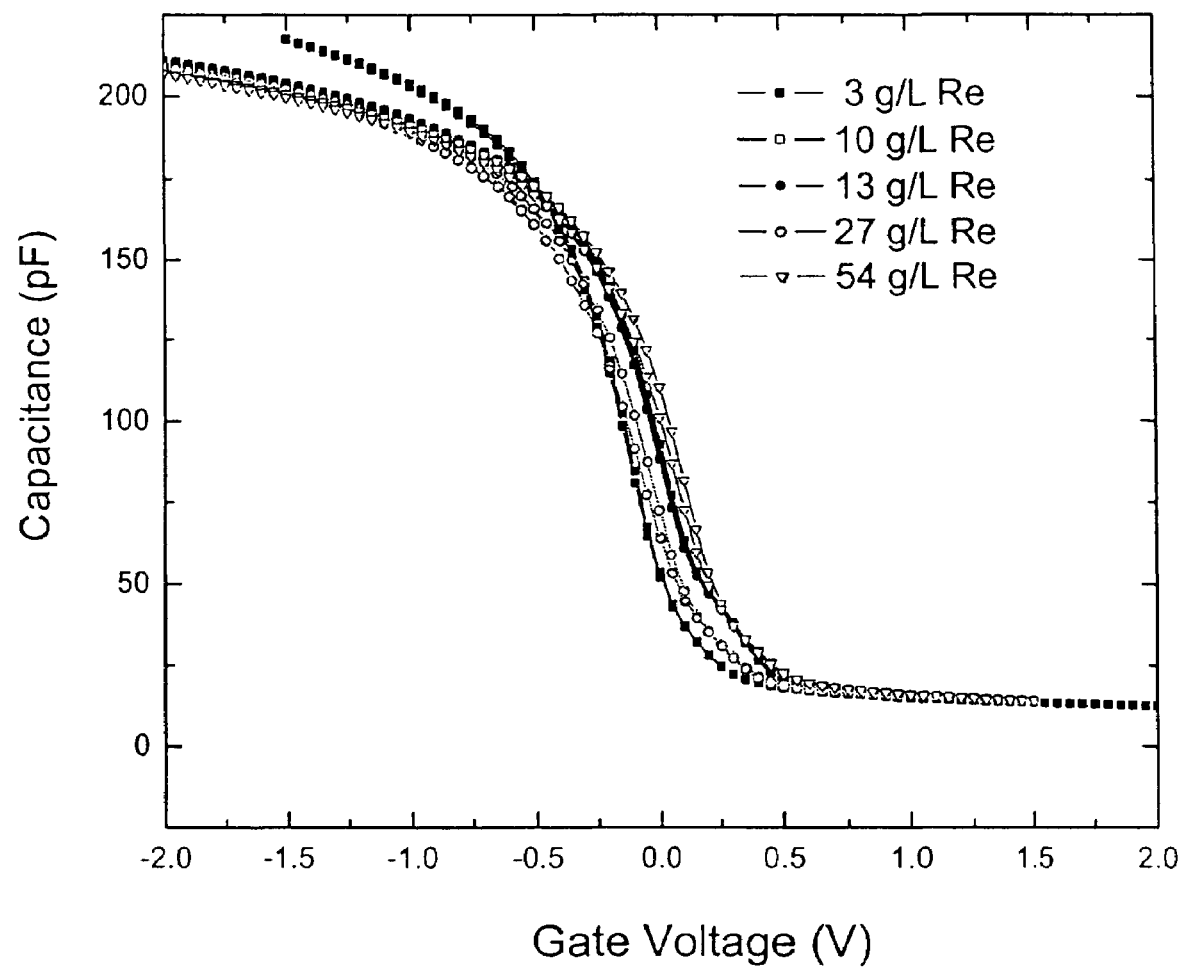

FIGS. 18A and 18B show typical examples of capacitance-voltage characteristics for Re gates measured in the (100 micrometer by 100 micrometer) MOS test structures, fabricated for solutions with changing ammonium perrhenate concentration for n-type and p-type Si substrates. For n-type substrates, Re was deposited galvanostatically (10 mA/cm$^2$ for 120 s, 100 rpm at room temperature). For the p-type substrates, Re was deposited potentiostatically under white-light illumination (−3V vs. SCE; 21V/150 W halogen light, 100 rpm). These examples illustrate the exceptional capabilities of the through-gate-stack electroplating technique for tailoring the electrical properties of the metal gates for different substrates.

FIG. 19 shows typical examples of capacitance-voltage characteristics for Ru gates measured in the (100 micrometer by 100 micrometer) MOS test structures, fabricated by galvanostatic electrodeposition from RuCl$_3$ based solutions (10 mA/cm$^2$ for 120 s; 400 rpm) on n-Si/SiON(1 nm)HfO2(4 nm) and annealed under different conditions. These examples illustrate the stable p-FET properties after heat treatment of electroplated metal gates by through-gate-stack current flow.

Processes falling within the scope of the present invention may additionally include electrochemical etching or electroetching to selectively remove all or part of an oxide or insulator. Specific applications of such processes can include etching of a shallow trench pattern by the use of a mask or by damage track pattern, written by an e-beam or ion-beam. In addition, electroetching processes can include formation of porous films such as porous Si.

Electrochemical processes falling within the scope of the present invention can further include electrochemical anodization, such as anodic oxidation, wherein the thickness of an oxide layer can be selectively increased or at least one additional oxide layer can be deposited above a first oxide layer. Such methods typically require the mask oxide to be thicker than the desired final oxide thickness or the conductivity of the grown oxide to be sufficiently lower than the conductivity of the surrounding dielectric.

In addition to the above, electrochemical processes falling within the scope of the present invention may include electrochemical modification of an oxide insulator. Such processes can, for example, entail change in the surface chemistry of an insulator by incorporation of a halogen, such as Cl, Br and I, and/or incorporation of other elements or materials, including, N, C, P, O, metals, such as Hf, Zr, Al, and/or Ti, and materials that can act as semiconductors, such as Si and Ge. These materials can be incorporated at the surface of the insulator or in the bulk of the gate dielectric. Processes for such electrochemical modification can include, for example:

(1) anodic oxidation or nitridation of a gate dielectric in order to decrease the concentration of structural or electrical defect states, such as traps or interface states;
(2) anodic oxidation or nitridation of a metal-containing gate dielectric, such as HfO$_2$, prior to deposition of a Si gate electrode in order to minimize formation of interfacial metal-silicon bonds (such bonds have been proposed to cause the 'V$_t$ shift problem' in pFETs involving Hf-based dielectrics with poly-Si gates in which the threshold voltage is consistently found to be about 0.6 V more negative for SiO$_2$ based devices; see C. Hobbs et al., VLSI 2003 Digest, p. 9);
(3) nitrogen incorporation into a gate dielectric film, to form a dielectric with increased thermal stability and more efficient suppression of oxygen diffusion and boron penetration (such increased stability is thought to be critical in preventing structural changes of the gate stack during thermal processing of the device, such as source/drain activation);
(4) incorporation of elements such as S, Se, and Cl into the dielectric in order to change the thermodynamics of vacancy formation and thereby minimize the concentration of electrical defects;
(5) hydrogenation of dangling bonds at the dielectric-substrate interface in order to decrease the concentration of interface states, for example by correct choice of potential program;
(6) metal or semiconductor incorporation into a gate dielectric film to form a dielectric with more desirable properties, such as higher permittivity, higher band gap, or higher thermal stability;
(7) formation of a thin metal or semiconductor film on top of the dielectric which is subsequently oxidized or nitridized to form part of the gate dielectric stack; and
(8) adsorption of dopant elements, such a B, Al, In, As or Sb on the dielectric surface to modify the work function and thresh-hold voltage of a subsequently formed conductive gate.

While the present invention has been described in an illustrative manner, it should be understood that the terminology used is intended to be in a nature of words or description rather than of limitation. Furthermore, while the present invention has been described in terms of several illustrative embodiments, it is to be appreciated that those skilled in the art will readily apply these teachings to other possible variations of the inventions.

What is claimed as new and desired to be protected by Letters Patent of the United States is:

1. A method for processing at least one dielectric comprising the steps of:
   (i) providing at least one dielectric on a conducting and/or semiconducting substrate wherein said at least one dielectric is at least partially immersed in an electrolyte solution or melt, said electrolyte solution or melt comprising at least one active ingredient for electrodeposition;
   (ii) providing at least one auxiliary electrode at least partially immersed in the electrolyte solution or melt; and
   (iii) applying a current or voltage between the substrate and auxiliary electrode, wherein the voltage applied is less than about 10 volts and provides for sufficient current to pass through the dielectric to said auxiliary electrode to enable electrodeposition at the dielectric as a result of the current passed through the dielectric;

wherein the dielectric layer comprises at least one layer selected from the group consisting of $SiO_2$, silicon oxynitride (SiON), $GeO_2$, GeON, $Al_2O_3$, $HfO_2$, $Ta_2O_5$, $La_2O_5$, $ZrO_2$, and $Y_2O_3$, and alloys, mixtures, and multilayers of the same with the inclusion of nitrogen, silicon, and carbon.

2. The method of claim 1, further comprising at least one step selected from the group consisting of:
electroplating or electrodeposition of a conducting or semiconducting material on the dielectric and electrochemical modification of the dielectric.

3. The method of claim 2, wherein said at least one dielectric comprises a dielectric with at least a partial overcoat of a conducting or semiconducting layer.

4. The method of claim 2, wherein said electrodeposition is nonselective and relatively uniform over the surface of the dielectric layer.

5. The method of claim 2, wherein said electrodeposition is selective, occurring only on selected regions of said dielectric.

6. The method of claim 5, wherein said selective electrodeposition is effected by making said at least one dielectric have a first total thickness in at least one first region where an electrochemical processing is desired and a second total thickness in at least one second region where electrochemical processing is not desired.

7. The method of claim 5, wherein said selective electrodeposition is effected by changing the material of the dielectric in selected regions to make the dielectric more or less resistive to current flow, said method comprising at least one step selected from the group consisting of: damaging the dielectric; reacting the dielectric with another material; replacing the dielectric with another dielectric; and augmenting the dielectric with another dielectric.

8. The method of claim 5, wherein said selective electrodeposition is effected by selecting a substrate having at least one first substrate region having a first carrier type and density over which electrochemical processing is desired, and at least one second substrate region having a second carrier type and density over which electrochemical processing is not desired.

9. The method of claim 5, wherein said selective electrodeposition is effected by selecting a substrate having at least one first substrate region having a first composition over which electrochemical processing is desired, and at least one second substrate region having a second composition over which electrochemical processing is not desired.

10. The method of claim 5, wherein said selective electrodeposition is effected by patterned exposure to light illumination, wherein at least one first substrate region over which a first electrochemical process is desired is exposed to light illumination, and at least one second substrate region over which electrochemical processing is not desired is not exposed to light illumination.

11. The method of claim 10, wherein said patterned exposure is effected by a writable laser.

12. The method of claim 10, wherein said patterned exposure is effected by a light-blocking mask placed in front of the dielectric or disposed on the dielectric.

13. The method of claim 5, wherein said selective electrodeposition is effected by an atomic-force microscope (AFM) tip or scanning-tunneling microscope (STM) tip, wherein the tip is placed over at least one substrate region where electrodeposition is desired, and writing of electroprocessed structures is effected by moving the tip over the dielectric surface following the desired pattern.

14. The method of claim 2, wherein the thickness of the dielectric ranges from about 0.2 nm to about 100 nm.

15. The method of claim 14, wherein the thickness of the dielectric ranges from about 1 nm to about 25 nm.

16. The method of claim 2, wherein the applied current density ranges from about 10 $\mu A/cm^2$ to about 1 $A/cm^2$.

17. The method of claim 2, wherein the applied voltage results in current densities ranging from about 10 $\mu A/cm^2$ to about 1 $A/cm^2$.

18. The method of claim 2, wherein said electrochemical process is assisted by blanket light illumination, wherein the process comprises front-side and/or back-side illumination.

19. The method of claim 2, wherein the substrate is selected from the group consisting of: metals, conductive metal oxides, conductive metal sulfides, conductive metal phosphides, conductive metal borides, conductive metal nitrides, conductive metal silicides, conductive metal carbides, conductive polymers, and alloys, mixtures, and multilayers of the same.

20. The method of claim 19, wherein the metals are selected from the group consisting of Ag, Al, As, Au, Cd, Co, Cu, Hf, Ir, Ga, Ge, Fe, In, Mo, Nb, Ni, P, Pb, Pd, Pt, Ru, Re, Rh, Se, Si, Sb, Sn, Ta, Ti, W, V, Zn, and Zr, and alloys, mixtures, and multilayers of the same.

21. The method of claim 2, wherein the substrate has a nonplanar topography.

22. The method of claim 5, further comprising the step of planarizing electrodeposited material to expose at least one selected region of said dielectric.

23. The method of claim 2, wherein the said substrate comprises at least one material selected from the group consisting of:
(i) one or more doped or undoped semiconductors, comprising Si, Ge, and combinations thereof, and combinations thereof including C;
(ii) doped or undoped binary, tertiary and quaternary semiconductors comprising at least two materials selected from the group consisting of Ga, As, P, Sb, In, Se and Al;
(iii) doped or undoped II-VI semiconductors comprising Cd, Zn, Te, Se, and S;
(iv) doped or undoped oxide semiconductors;
(v) semiconducting or electroluminescent polymers;
(vi) semiconductor multilayers and mixed layers; and
(vii) semiconductor-on-insulator combinations.

24. The method of claim 2, wherein the electroplated conductive material comprises a material selected from the group consisting of a metal, a metal oxide, a metal phosphide, a metal sulfide, and a metal boride wherein the metal is selected from the group consisting of Ru, Re, Ni, Pd, Co, Tc, Pt, Rh, Cr, Mn, Os, Ir, Si, Ge, Sb, Bi, Sn, In, Fe, Zn, Cd, Se, Te, Cu, Ag, Au, and Pb, and alloys, mixtures, and multilayers of the same, and alloys, mixtures, and multilayers of the same with at least one additional metal selected from the group consisting of Al, Mg, W, V, Ti, Ta, Mo, Ce, Ga, Gd, Hf, Zr, La, Y, Sr, Tl, Eu, Dy, Ho, and Nb.

25. The method of claim 2, wherein the thickness of said electrodeposited material ranges from about 1 nm to about 5000 nm.

26. The method of claim 2, wherein the electrolyte solution is selected from the group consisting of:
(i) a plating solution comprising $(NH_4)_2PtCl_6$, having a concentration ranging from about 0.001 moles/liter to about 0.1 moles/liter and $Na_2HPO_4$, having a concentration of up to about 1 mole/liter, wherein the solution has a pH ranging from about 2 to about 9;

(ii) a plating solution comprising about 1 to about 30 g/l of $Rh_2SO_4$ and about 1 to about 100 ml/l of $H_2SO_4$;

(iii) a plating solution comprising about 1 g/l to about 20 g/l of $RuCl_3.xH_2O$, about 1 g/l to about 10 g/l of $NaNO_2$, up to about 40 ml/l of $NH_4OH$ (28 wt %), and up to about 40 ml/l of HCl (38 wt %), wherein the solution has a pH ranging from about 1 to about 9;

(iv) a plating solution comprising about 0.001 moles/liter to about 0.025 moles/liter of $RuCl_3$, up to about 1 mole/liter of HCl, and up to about 1 mole/liter of $H_3BO_3$; and (v) a plating solution comprising about 1 g/l to about 100 g/l of $NH_4ReO_4$ and about 1 ml/l to about 250 ml/l of HCl (38 wt %).

27. The method of claim 26, wherein the electrolyte solution is selected from the group consisting of:

(i) a plating solution comprising $(NH_4)_2PtCl_6$, having a concentration of about 0.01 moles/liter, and $Na_2HPO_4$, having a concentration of about 0.4 moles/liter, wherein the solution has a pH of about 7;

(ii) a plating solution comprising about 10 g/l of $Rh_2SO_4$ and about 10 ml/l of $H_2SO_4$;

(iii) a plating solution comprising about 5.2 g/l of $RuCl_3.xH_2O$, about 5.2 g/l of $NaNO_2$, about 8 ml/l of $NH_4OH$, and about 4 ml/l of HCl, wherein the solution has a pH of about 2.3;

(iv) a plating solution comprising about 0.02 moles/liter of $RuCl_3$, 0.05 mole/liter of HCl, and about 0.4 mole/liter of $H_3BO_3$; and (v) a plating solution comprising about 10 g/l of $NH_4ReO_4$ and about 10 ml/l of HCl (38 wt. %) wherein the solution has a pH of about 1 to about 2.

28. The method of claim 2, wherein electrical contact is made to the substrate by a contact arrangement selected from the group consisting of a dry solid-state contact and a wet electrochemical contact.

29. The method of claim 28, wherein the dry solid state contact is made by ion implantation with at least one element selected from the group consisting of As, P, B, Si, Al, and Sb.

30. The method of claim 28, wherein the dry solid state contact is formed by metal deposition, where the metal is selected from the group consisting of Zn, In, Ga, Sn, Pb, Au, Ag, Cu, and alloys, mixtures, and multilayers of the same.

31. The method of claim 2, wherein the electrochemical modification comprises modification of the surface of the dielectric by incorporation of at least one element selected from the group consisting of:

(i) halogens (F, Cl, Br, and I);

(ii) the metals Hf, Zr, Ta, La, Al, Ti, Sb and In; and (iii) other elements selected from the group consisting of N, C, B, P, O, S, Si, Ge, As, and combinations thereof.

32. The method of claim 2, wherein the electrochemical modification comprises modification of the bulk of the dielectric by incorporation of at least one element selected from the group consisting of:

(i) halogens (F, Cl, Br, and I);

(ii) the metals Hf, Zr, Ta, La, Al, Ti, Sb and In; and (iii) other elements selected from the group consisting of N, C, B, P, O, S, Si, Ge, As, and combinations thereof.

33. The method of claim 2, wherein electrochemical modification comprises anodic oxidation or nitridation of the dielectric in order to decrease the concentration of structural or electrical defect states, such as traps or interface states.

34. The method of claim 2, wherein electrochemical modification comprises anodic oxidation or nitridation of a metal-containing gate dielectric, prior to deposition of a Si gate electrode in order to minimize formation of interfacial metal-silicon bonds.

35. The method of claim 2, wherein electrochemical modification comprises nitrogen incorporation into a gate dielectric film, to form a dielectric with increased thermal stability and more efficient suppression of oxygen diffusion and boron penetration.

36. The method of claim 2, wherein electrochemical modification comprises hydrogenation of dangling bonds at the dielectric-substrate interface in order to decrease the concentration of interface states.

37. The method of claim 2, wherein electrochemical modification comprises metal or semiconductor incorporation into a gate dielectric film to form a dielectric to enhance at least one property selected from the group consisting of higher permittivity, higher band gap, and higher thermal stability.

38. The method of claim 2, wherein electrochemical modification comprises formation of a thin metal or semiconductor film on top of the dielectric which is subsequently oxidized or nitridized to form part of the gate dielectric stack.

39. The method of claim 2, wherein the method is provided to modify the work function and thresh-hold voltage of a subsequently formed conductive gate.

* * * * *